(12) United States Patent
Inamdar et al.

(10) Patent No.: US 10,222,416 B1
(45) Date of Patent: Mar. 5, 2019

(54) SYSTEM AND METHOD FOR ARRAY DIAGNOSTICS IN SUPERCONDUCTING INTEGRATED CIRCUIT

(71) Applicant: Hypres, Inc., Elmsford, NY (US)

(72) Inventors: Amol Inamdar, Elmsford, NY (US); Jie Ren, Elmwood Park, NJ (US); Denis Amparo, White Plains, NY (US)

(73) Assignee: Hypres, Inc., Elmsford, NY (US)

( * ) Notice: Subject to any disclaimer, the term of this patent is extended or adjusted under 35 U.S.C. 154(b) by 282 days.

(21) Appl. No.: 15/097,930

(22) Filed: Apr. 13, 2016

Related U.S. Application Data

(60) Provisional application No. 62/147,455, filed on Apr. 14, 2015.

(51) Int. Cl.
| | | |
|---|---|---|
| *H03K 23/00* | (2006.01) | |
| *G01R 31/317* | (2006.01) | |
| *H01L 27/18* | (2006.01) | |
| *G01R 31/3181* | (2006.01) | |

(52) U.S. Cl.
CPC ... *G01R 31/31712* (2013.01); *G01R 31/3181* (2013.01); *G01R 31/31727* (2013.01); *H01L 27/18* (2013.01)

(58) Field of Classification Search
None
See application file for complete search history.

(56) References Cited

U.S. PATENT DOCUMENTS

| | | |
|---|---|---|
| 3,949,395 A | 4/1976 | Klein |
| 3,953,749 A | 4/1976 | Baechtold et al. |
| 3,970,965 A | 7/1976 | Shapiro et al. |
| 3,987,309 A | 10/1976 | Hamel et al. |
| 4,012,642 A | 3/1977 | Gueret |
| 4,051,393 A | 9/1977 | Fulton |
| 4,097,765 A | 6/1978 | Zappe |
| 4,107,554 A | 8/1978 | Yao |
| 4,109,169 A | 8/1978 | Tantrapom et al. |
| 4,109,522 A | 8/1978 | Thompson |
| 4,117,354 A | 9/1978 | Geewala |
| 4,145,699 A | 3/1979 | Hu et al. |
| 4,168,441 A | 9/1979 | McDonald et al. |
| 4,176,290 A | 11/1979 | Ishida et al. |
| 4,181,902 A | 1/1980 | Scott |
| 4,186,441 A | 1/1980 | Baechtold et al. |
| 4,227,096 A | 10/1980 | Frosch et al. |
| 4,245,169 A | 1/1981 | Hamilton |
| 4,249,094 A | 2/1981 | Fulton |
| 4,275,314 A | 6/1981 | Fulton |
| 4,330,841 A | 5/1982 | Yamada et al. |

(Continued)

*Primary Examiner* — Crystal L Hammond
(74) *Attorney, Agent, or Firm* — Tully Rinckey PLLC; Steven M. Hoffberg

(57) ABSTRACT

A superconducting circuit is disclosed for fast digital readout of on-chip diagnostics in an array of devices in an integrated circuit. The digital readout comprises a digital RSFQ multiplexer to select the readout channel. This permits a large number of devices to be tested with a minimum of input and output lines. The devices may comprise digital devices (such as elementary RSFQ cells), or analog devices (such as inductors, resistors, or Josephson junctions) with a SQUID quantizer to generate a digital signal. The diagnostic array and the digital multiplexer are preferably configured to operate as part of the same integrated circuit at cryogenic temperatures.

23 Claims, 14 Drawing Sheets

(56) References Cited

U.S. PATENT DOCUMENTS

| | | |
|---|---|---|
| 4,342,924 A | 8/1982 | Howard et al. |
| 4,344,052 A | 8/1982 | Davidson |
| 4,361,768 A | 11/1982 | Rajeevakumar |
| 4,371,796 A | 2/1983 | Takada |
| 4,373,138 A | 2/1983 | Fulton et al. |
| 4,400,631 A | 8/1983 | Fulton |
| 4,401,900 A | 8/1983 | Faris |
| 4,403,189 A | 9/1983 | Simmonds |
| 4,423,430 A | 12/1983 | Hasuo et al. |
| 4,468,635 A | 8/1984 | Lukens et al. |
| 4,470,023 A | 9/1984 | Lukens et al. |
| 4,482,821 A | 11/1984 | Houkawa et al. |
| 4,496,854 A | 1/1985 | Chi et al. |
| 4,506,166 A | 3/1985 | Sone |
| 4,506,172 A | 3/1985 | Hasuo |
| 4,509,018 A | 4/1985 | Gershenson |
| 4,509,146 A | 4/1985 | Wang et al. |
| 4,521,682 A | 6/1985 | Murakami et al. |
| 4,533,840 A | 8/1985 | Gheewala et al. |
| 4,538,077 A | 8/1985 | Sone |
| 4,544,937 A | 10/1985 | Kroger |
| 4,551,704 A | 11/1985 | Anderson |
| 4,554,567 A | 11/1985 | Jillie et al. |
| 4,555,643 A | 11/1985 | Kotera et al. |
| 4,559,459 A | 12/1985 | Wang et al. |
| 4,567,383 A | 1/1986 | Goto et al. |
| 4,567,438 A | 1/1986 | Gershenson et al. |
| 4,578,691 A | 3/1986 | Murakami et al. |
| 4,585,999 A | 4/1986 | Hilbert et al. |
| 4,589,001 A | 5/1986 | Sakai et al. |
| 4,611,132 A | 9/1986 | Sone |
| 4,626,701 A | 12/1986 | Harada et al. |
| 4,630,005 A | 12/1986 | Clegg et al. |
| 4,631,423 A | 12/1986 | Faris |
| 4,638,185 A | 1/1987 | Kobayashi et al. |
| 4,638,257 A | 1/1987 | McDonald |
| 4,646,060 A | 2/1987 | Phillips et al. |
| 4,672,244 A | 6/1987 | Harada et al. |
| 4,678,945 A | 7/1987 | Sugano et al. |
| 4,687,987 A | 8/1987 | Kuchnir et al. |
| 4,710,651 A | 12/1987 | Suzuki |
| 4,713,562 A | 12/1987 | Hasuo et al. |
| 4,733,182 A | 3/1988 | Clarke et al. |
| 4,748,630 A | 5/1988 | Nagashima |
| 4,749,888 A | 6/1988 | Sakai et al. |
| 4,764,898 A | 8/1988 | Miyahara et al. |
| 4,777,443 A | 10/1988 | Yabusaki et al. |
| 4,785,426 A | 11/1988 | Harada et al. |
| 4,789,794 A | 12/1988 | Whiteley et al. |
| 4,812,689 A | 3/1989 | Whiteley |
| 4,814,598 A | 3/1989 | Faris |
| 4,823,026 A | 4/1989 | Hanson |
| 4,837,604 A | 6/1989 | Faris |
| 4,847,514 A | 7/1989 | Ueda et al. |
| 4,866,302 A | 9/1989 | Whiteley et al. |
| 4,869,598 A | 9/1989 | McDonald |
| 4,879,488 A | 11/1989 | Silver |
| 4,906,930 A | 3/1990 | Nakane et al. |
| 4,918,328 A | 4/1990 | Kuo |
| 4,922,250 A | 5/1990 | Phillips et al. |
| 4,926,067 A | 5/1990 | Whiteley |
| 4,947,118 A | 8/1990 | Fujimaki |
| 4,962,316 A | 10/1990 | Jack |
| 4,974,205 A | 11/1990 | Kotani |
| 4,977,402 A | 12/1990 | Ko |
| 4,982,080 A | 1/1991 | Wilson et al. |
| 4,983,971 A | 1/1991 | Przybysz et al. |
| 5,012,243 A | 4/1991 | Lee |
| 5,019,721 A | 5/1991 | Martens et al. |
| 5,019,818 A | 5/1991 | Lee |
| 5,021,658 A | 6/1991 | Bluzer |
| 5,024,993 A | 6/1991 | Kroger et al. |
| 5,039,656 A | 8/1991 | Hidaka |
| 5,051,627 A | 9/1991 | Schneier et al. |
| 5,051,787 A | 9/1991 | Hasegawa |
| 5,053,834 A | 10/1991 | Simmonds |
| 5,058,431 A | 10/1991 | Karwacki |
| 5,077,266 A | 12/1991 | Takagi et al. |
| 5,093,618 A | 3/1992 | Goto et al. |
| 5,099,152 A | 3/1992 | Suzuki |
| 5,109,164 A | 4/1992 | Matsui |
| 5,111,082 A | 5/1992 | Harada |
| 5,114,912 A | 5/1992 | Benz |
| 5,124,583 A | 6/1992 | Hatano et al. |
| 5,126,568 A | 6/1992 | Durst |
| 5,126,598 A | 6/1992 | Kotani |
| 5,140,324 A | 8/1992 | Przybysz et al. |
| 5,146,119 A | 9/1992 | Kamikawai et al. |
| 5,155,093 A | 10/1992 | Den et al. |
| 5,155,434 A | 10/1992 | Fujimaki |
| 5,162,298 A | 11/1992 | Chaudhari et al. |
| 5,162,731 A | 11/1992 | Fujimaki |
| 5,164,618 A | 11/1992 | Murphy et al. |
| 5,166,614 A | 11/1992 | Yokosawa et al. |
| 5,170,080 A | 12/1992 | Murphy et al. |
| 5,191,236 A | 3/1993 | Ruby |
| 5,192,951 A | 3/1993 | Ko |
| 5,193,909 A | 3/1993 | Duncan |
| 5,194,807 A | 3/1993 | Ueda |
| 5,198,815 A | 3/1993 | Przybysz et al. |
| 5,218,297 A | 6/1993 | Nakane et al. |
| 5,219,828 A | 6/1993 | Shintaku et al. |
| 5,229,655 A | 7/1993 | Martens et al. |
| 5,233,242 A | 8/1993 | Murphy et al. |
| 5,233,243 A | 8/1993 | Murphy et al. |
| 5,233,244 A | 8/1993 | Suzuki |
| 5,250,506 A | 10/1993 | Saitoh et al. |
| 5,253,199 A | 10/1993 | Gibson |
| 5,254,945 A | 10/1993 | Nojima et al. |
| 5,262,395 A | 11/1993 | Ginley et al. |
| 5,266,844 A | 11/1993 | Ko et al. |
| 5,272,479 A | 12/1993 | Silver |
| 5,276,639 A | 1/1994 | Inoue |
| 5,278,140 A | 1/1994 | Chaudhari et al. |
| 5,285,155 A | 2/1994 | Ueda et al. |
| 5,286,710 A | 2/1994 | Hascicek et al. |
| 5,287,057 A | 2/1994 | Gotoh |
| 5,294,884 A | 3/1994 | Goto et al. |
| 5,295,093 A | 3/1994 | Nagasawa |
| 5,309,038 A | 5/1994 | Harada et al. |
| 5,315,180 A | 5/1994 | Kotani |
| 5,318,951 A | 6/1994 | Shintaku et al. |
| 5,319,307 A | 6/1994 | Simmonds |
| 5,321,004 A | 6/1994 | Perez et al. |
| 5,323,344 A | 6/1994 | Katayama et al. |
| 5,326,986 A | 7/1994 | Miller, Jr. et al. |
| 5,327,130 A | 7/1994 | Kang et al. |
| 5,331,162 A | 7/1994 | Silver et al. |
| 5,334,884 A | 8/1994 | Tesche |
| 5,339,457 A | 8/1994 | Kawasaki et al. |
| 5,341,136 A | 8/1994 | Przybysz et al. |
| 5,343,081 A | 8/1994 | Nakamura |
| 5,345,114 A | 9/1994 | Ma et al. |
| 5,352,978 A | 10/1994 | Nojima et al. |
| 5,355,035 A | 10/1994 | Vora et al. |
| 5,355,085 A | 10/1994 | Igarashi et al. |
| 5,358,928 A | 10/1994 | Ginley et al. |
| 5,376,624 A | 12/1994 | Perez et al. |
| 5,378,999 A | 1/1995 | Martens et al. |
| 5,388,068 A | 2/1995 | Ghoshal et al. |
| 5,389,837 A | 2/1995 | Hietala et al. |
| 5,396,242 A | 3/1995 | Lee |
| 5,400,026 A | 3/1995 | Bradley |
| 5,406,133 A | 4/1995 | Vora et al. |
| 5,420,586 A | 5/1995 | Radparvar |
| 5,424,641 A | 6/1995 | Gotoh |
| 5,424,656 A | 6/1995 | Gibson et al. |
| 5,434,530 A | 7/1995 | Ghoshal et al. |
| 5,436,451 A | 7/1995 | Silver et al. |
| 5,442,195 A | 8/1995 | Saitoh et al. |
| 5,455,451 A | 10/1995 | Usagawa et al. |
| 5,455,519 A | 10/1995 | Ohori |
| 5,464,813 A | 11/1995 | Hascicek et al. |
| 5,472,934 A | 12/1995 | Akoh et al. |

(56) References Cited

U.S. PATENT DOCUMENTS

| | | | |
|---|---|---|---|
| 5,479,131 | A | 12/1995 | Lee |
| 5,488,295 | A | 1/1996 | Seppa |
| 5,493,719 | A | 2/1996 | Smith et al. |
| 5,532,485 | A | 7/1996 | Bluzer et al. |
| 5,532,592 | A | 7/1996 | Colclough |
| 5,552,735 | A * | 9/1996 | Kang ................ H03K 17/92 327/367 |
| 5,565,866 | A | 10/1996 | Hamilton et al. |
| 5,570,059 | A | 10/1996 | Vora et al. |
| 5,574,369 | A | 11/1996 | Hibbs |
| 5,600,172 | A | 2/1997 | McDevitt et al. |
| 5,600,242 | A | 2/1997 | Hubbell |
| 5,610,510 | A | 3/1997 | Boone et al. |
| 5,610,857 | A | 3/1997 | Nandakumar |
| 5,625,290 | A | 4/1997 | You |
| 5,629,889 | A | 5/1997 | Chandra et al. |
| 5,646,526 | A | 7/1997 | Takeda et al. |
| 5,656,937 | A | 8/1997 | Cantor |
| 5,668,495 | A | 9/1997 | Vora et al. |
| 5,682,042 | A | 10/1997 | Amer et al. |
| 5,706,192 | A | 1/1998 | Schwartz et al. |
| 5,764,048 | A | 6/1998 | Yoshida |
| 5,767,043 | A | 6/1998 | Cantor et al. |
| 5,818,373 | A | 10/1998 | Semenov et al. |
| 5,831,278 | A | 11/1998 | Berkowitz |
| 5,834,794 | A | 11/1998 | Fuke et al. |
| 5,844,407 | A | 12/1998 | Hubbell |
| 5,854,604 | A | 12/1998 | Przybysz et al. |
| 5,869,846 | A | 2/1999 | Higashino et al. |
| 5,872,368 | A | 2/1999 | Osofsky et al. |
| 5,877,592 | A | 3/1999 | Hesterman et al. |
| 5,880,647 | A | 3/1999 | Kim |
| 5,912,503 | A | 6/1999 | Chan et al. |
| 5,920,811 | A | 7/1999 | Suzuki et al. |
| 5,930,165 | A | 7/1999 | Johnson et al. |
| 5,933,001 | A | 8/1999 | Hubbell |
| 5,936,458 | A | 8/1999 | Rylov |
| 5,939,871 | A | 8/1999 | Tanaka |
| 5,942,765 | A | 8/1999 | Miyahara et al. |
| 5,942,997 | A * | 8/1999 | Silver ................ H03M 1/121 341/133 |
| 5,955,400 | A | 9/1999 | Yokosawa et al. |
| 5,963,351 | A * | 10/1999 | Kaplounenko .......... H03L 7/24 329/346 |
| 5,982,219 | A | 11/1999 | Kirichenko |
| 5,994,891 | A | 11/1999 | Hubbell |
| 6,002,268 | A | 12/1999 | Sasaki et al. |
| 6,005,380 | A | 12/1999 | Hubbell |
| 6,008,642 | A | 12/1999 | Bulsara et al. |
| 6,025,736 | A | 2/2000 | Vora et al. |
| 6,051,440 | A | 4/2000 | Chan et al. |
| 6,078,517 | A * | 6/2000 | Herr ................ G11C 11/44 365/160 |
| 6,118,284 | A | 9/2000 | Ghoshal et al. |
| 6,130,550 | A | 10/2000 | Zaliznyak et al. |
| 6,157,329 | A | 12/2000 | Lee et al. |
| 6,169,397 | B1 | 1/2001 | Steinbach et al. |
| 6,188,236 | B1 | 2/2001 | Wikborg |
| 6,236,344 | B1 | 5/2001 | Benz et al. |
| 6,239,431 | B1 | 5/2001 | Hilton et al. |
| 6,242,939 | B1 | 6/2001 | Nagasawa et al. |
| 6,263,189 | B1 | 7/2001 | Reagor |
| 6,285,186 | B1 | 9/2001 | Morooka |
| 6,310,488 | B1 | 10/2001 | Hasegawa et al. |
| 6,320,369 | B1 | 11/2001 | Hidaka et al. |
| 6,323,645 | B1 | 11/2001 | Morooka et al. |
| 6,331,805 | B1 * | 12/2001 | Gupta ................ H03B 15/00 327/528 |
| 6,348,699 | B1 | 2/2002 | Zehe |
| 6,353,330 | B1 | 3/2002 | Kanda et al. |
| 6,362,617 | B1 | 3/2002 | Hubbell |
| 6,365,912 | B1 | 4/2002 | Booth et al. |
| 6,388,600 | B1 * | 5/2002 | Johnson ................ H03M 1/60 341/133 |
| 6,414,870 | B1 | 7/2002 | Johnson et al. |
| 6,420,895 | B1 | 7/2002 | Herr et al. |
| 6,483,339 | B1 | 11/2002 | Durand et al. |
| 6,486,694 | B1 | 11/2002 | Kirichenko |
| 6,486,756 | B2 | 11/2002 | Tarutani et al. |
| 6,507,234 | B1 * | 1/2003 | Johnson ................ H03K 3/38 327/186 |
| 6,509,853 | B2 | 1/2003 | Gupta |
| 6,518,673 | B2 | 2/2003 | Herr et al. |
| 6,549,059 | B1 | 4/2003 | Johnson |
| 6,552,537 | B2 | 4/2003 | Odawara |
| 6,573,202 | B2 | 6/2003 | Ivanov et al. |
| 6,576,951 | B2 | 6/2003 | Ivanov et al. |
| 6,580,102 | B2 | 6/2003 | Ivanov et al. |
| 6,580,310 | B2 | 6/2003 | Herr |
| 6,597,169 | B2 | 7/2003 | Morooka et al. |
| 6,605,822 | B1 | 8/2003 | Blais et al. |
| 6,608,518 | B2 | 8/2003 | Furuta et al. |
| 6,608,581 | B1 | 8/2003 | Semenov |
| 6,614,047 | B2 | 9/2003 | Tzalenchuk et al. |
| 6,627,915 | B1 | 9/2003 | Ustinov et al. |
| 6,642,608 | B1 | 11/2003 | Hu |
| 6,653,962 | B2 | 11/2003 | Gupta et al. |
| 6,670,630 | B2 | 12/2003 | Blais et al. |
| 6,690,162 | B1 | 2/2004 | Schopohl et al. |
| 6,724,216 | B2 | 4/2004 | Suzuki et al. |
| 6,725,248 | B1 | 4/2004 | Hasegawa et al. |
| 6,728,131 | B2 | 4/2004 | Ustinov |
| 6,734,699 | B1 | 5/2004 | Herr et al. |
| 6,744,308 | B1 | 6/2004 | Beumer |
| 6,750,794 | B1 | 6/2004 | Durand et al. |
| 6,756,925 | B1 * | 6/2004 | Leung ................ H04L 25/4904 331/11 |
| 6,759,974 | B1 | 7/2004 | Herr |
| 6,777,808 | B2 | 8/2004 | Herr et al. |
| 6,784,451 | B2 | 8/2004 | Amin et al. |
| 6,791,109 | B2 | 9/2004 | Tzalenchuk et al. |
| 6,803,599 | B2 | 10/2004 | Amin et al. |
| 6,812,484 | B2 | 11/2004 | Tzalenchuk et al. |
| 6,815,708 | B2 | 11/2004 | Iguchi et al. |
| 6,822,255 | B2 | 11/2004 | Tzalenchuk et al. |
| 6,836,141 | B2 | 12/2004 | Herr |
| 6,838,404 | B2 | 1/2005 | Hentges et al. |
| 6,838,694 | B2 | 1/2005 | Esteve et al. |
| 6,853,185 | B2 | 2/2005 | Tsukamoto et al. |
| 6,885,325 | B2 | 4/2005 | Omelyanchouk et al. |
| 6,897,468 | B2 | 5/2005 | Blais et al. |
| 6,900,454 | B2 | 5/2005 | Blais et al. |
| 6,900,456 | B2 | 5/2005 | Blais et al. |
| 6,908,771 | B2 | 6/2005 | Lee et al. |
| 6,909,109 | B2 | 6/2005 | Herr |
| 6,909,886 | B2 | 6/2005 | Magnusen et al. |
| 6,919,579 | B2 | 7/2005 | Amin et al. |
| 6,922,066 | B2 | 7/2005 | Hidaka |
| 6,922,556 | B2 | 7/2005 | Beumer |
| 6,930,318 | B2 | 8/2005 | Vion et al. |
| 6,930,320 | B2 | 8/2005 | Blais et al. |
| 6,936,841 | B2 | 8/2005 | Amin et al. |
| 6,949,970 | B2 | 9/2005 | Ishizaki et al. |
| 6,960,780 | B2 | 11/2005 | Blais et al. |
| 6,979,836 | B2 | 12/2005 | Zagoskin et al. |
| 6,987,282 | B2 | 1/2006 | Amin et al. |
| 6,993,310 | B2 | 1/2006 | Magnusen et al. |
| 7,002,174 | B2 | 2/2006 | Ilichev et al. |
| 7,002,366 | B2 | 2/2006 | Eaton et al. |
| 7,075,171 | B2 | 7/2006 | Hato |
| 7,095,227 | B2 | 8/2006 | Tarutani et al. |
| 7,106,057 | B2 | 9/2006 | Matthews et al. |
| 7,129,869 | B2 | 10/2006 | Furuta et al. |
| 7,129,870 | B2 | 10/2006 | Hirano et al. |
| 7,135,701 | B2 | 11/2006 | Amin et al. |
| 7,227,480 | B2 | 6/2007 | Furuta et al. |
| 7,230,266 | B2 | 6/2007 | Hilton et al. |
| 7,242,918 | B2 | 7/2007 | Magnusen et al. |
| 7,248,044 | B2 | 7/2007 | Kobayashi et al. |
| 7,268,713 | B2 | 9/2007 | Suzuki et al. |
| 7,300,909 | B2 | 11/2007 | Hato et al. |
| 7,307,275 | B2 | 12/2007 | Lidar et al. |
| 7,332,738 | B2 | 2/2008 | Blais et al. |

(56) References Cited

U.S. PATENT DOCUMENTS

| | | |
|---|---|---|
| 7,364,923 B2 | 4/2008 | Lidar et al. |
| 7,365,663 B2 | 4/2008 | Rylov et al. |
| 7,378,865 B2 | 5/2008 | Taguchi et al. |
| 7,394,246 B2 | 7/2008 | Chieh et al. |
| 7,418,283 B2 | 8/2008 | Amin |
| 7,449,769 B2 | 11/2008 | Hato |
| 7,498,832 B2 | 3/2009 | Baumgardner et al. |
| 7,505,310 B2 | 3/2009 | Nagasawa et al. |
| 7,508,230 B2 | 3/2009 | Kirichenko |
| 7,521,708 B1 | 4/2009 | Agassi |
| 7,532,917 B2 | 5/2009 | Humphreys et al. |
| 7,533,068 B2 | 5/2009 | Maassen van den Brink et al. |
| 7,554,369 B2 * | 6/2009 | Kirichenko .......... H03K 23/763 327/117 |
| 7,557,600 B2 | 7/2009 | Chong et al. |
| 7,570,075 B2 | 8/2009 | Gupta et al. |
| 7,613,764 B1 | 11/2009 | Hilton et al. |
| 7,613,765 B1 | 11/2009 | Hilton et al. |
| 7,619,437 B2 | 11/2009 | Thom et al. |
| 7,624,088 B2 | 11/2009 | Johnson et al. |
| 7,680,474 B2 | 3/2010 | Kirichenko et al. |
| 7,714,605 B2 | 5/2010 | Baumgardner et al. |
| 7,719,453 B2 | 5/2010 | Kim et al. |
| 7,724,020 B2 | 5/2010 | Herr |
| 7,733,253 B2 | 6/2010 | Kirichenko |
| 7,750,664 B2 | 7/2010 | Kirichenko |
| 7,760,625 B2 | 7/2010 | Miyaho et al. |
| 7,772,871 B2 | 8/2010 | Herr et al. |
| 7,782,077 B2 | 8/2010 | Herr et al. |
| 7,786,748 B1 | 8/2010 | Herr |
| 7,786,786 B2 | 8/2010 | Kirichenko |
| 7,788,192 B2 | 8/2010 | Amin |
| 7,816,940 B1 | 10/2010 | Gupta et al. |
| 7,847,615 B2 | 12/2010 | Yorozu et al. |
| 7,852,106 B2 | 12/2010 | Herr et al. |
| 7,863,892 B2 | 1/2011 | Morley et al. |
| 7,868,645 B2 | 1/2011 | Herr et al. |
| 7,876,869 B1 | 1/2011 | Gupta |
| 7,893,708 B2 | 2/2011 | Baumgardner et al. |
| 7,912,530 B2 | 3/2011 | Seki et al. |
| 7,944,253 B1 | 5/2011 | Kirichenko |
| 7,953,174 B2 | 5/2011 | Asbeck et al. |
| 7,969,178 B2 | 6/2011 | Przybysz et al. |
| 7,969,805 B2 | 6/2011 | Thom et al. |
| 7,977,668 B2 | 7/2011 | Nevirkovets et al. |
| 7,977,964 B2 | 7/2011 | Herr |
| 7,991,814 B2 | 8/2011 | Filippov et al. |
| 8,008,942 B2 | 8/2011 | van den Brink et al. |
| 8,032,196 B2 | 10/2011 | Wakana et al. |
| 8,045,660 B1 | 10/2011 | Gupta |
| 8,050,648 B1 | 11/2011 | Kirichenko et al. |
| 8,055,318 B1 | 11/2011 | Kadin |
| 8,098,179 B2 | 1/2012 | Bunyk et al. |
| 8,130,880 B1 | 3/2012 | Gupta |
| 8,138,784 B2 | 3/2012 | Przybysz et al. |
| 8,155,726 B2 | 4/2012 | Seki et al. |
| 8,165,531 B2 | 4/2012 | Nikolova et al. |
| 8,179,133 B1 | 5/2012 | Kornev et al. |
| 8,188,901 B1 | 5/2012 | Inamdar et al. |
| 8,283,943 B2 | 10/2012 | van den Brink et al. |
| 8,284,585 B2 | 10/2012 | Maekawa et al. |
| 8,330,145 B2 | 12/2012 | Wakana et al. |
| 8,406,834 B2 | 3/2013 | Kirichenko |
| 8,437,168 B2 | 5/2013 | Maekawa et al. |
| 8,489,163 B2 | 7/2013 | Herr et al. |
| 8,504,497 B2 | 8/2013 | Amin |
| 8,508,280 B2 | 8/2013 | Naaman et al. |
| 8,514,986 B2 | 8/2013 | Gupta |
| 8,571,614 B1 * | 10/2013 | Mukhanov .............. H01L 27/18 505/170 |
| 8,593,141 B1 * | 11/2013 | Radparvar .......... G01R 33/323 324/248 |
| 8,610,453 B2 | 12/2013 | Herr |
| 8,633,472 B2 | 1/2014 | Boulaevskii et al. |
| 8,654,578 B2 | 2/2014 | Lewis et al. |
| 8,686,751 B2 | 4/2014 | van den Brink et al. |
| 8,698,570 B2 | 4/2014 | Afshari et al. |
| 8,781,542 B2 | 7/2014 | Tsukamoto et al. |
| 8,786,476 B2 | 7/2014 | Bunyk et al. |
| 8,861,619 B2 | 10/2014 | McDermott et al. |
| 8,872,690 B1 | 10/2014 | Inamdar et al. |
| 8,878,626 B2 | 11/2014 | Zmuidzinas et al. |
| 8,928,353 B2 | 1/2015 | Lynch et al. |
| 8,928,391 B2 | 1/2015 | Naaman et al. |
| 8,933,695 B1 | 1/2015 | Kornev et al. |
| 8,971,977 B2 | 3/2015 | Mukhanov et al. |
| 9,020,079 B2 | 4/2015 | Gupta |
| 9,030,119 B2 | 5/2015 | Jin |
| 9,069,928 B2 | 6/2015 | van den Brink et al. |
| 9,097,751 B1 | 8/2015 | Longhini et al. |
| 9,105,793 B2 | 8/2015 | Bouchiat et al. |
| 9,174,840 B2 | 11/2015 | Herr et al. |
| 9,240,773 B1 | 1/2016 | Mukhanov et al. |
| 9,252,825 B2 | 2/2016 | Gupta |
| 9,279,863 B2 | 3/2016 | Tsukamoto et al. |
| 9,281,057 B1 | 3/2016 | Herr et al. |
| 9,292,642 B2 | 3/2016 | Herr et al. |
| 9,312,878 B1 | 4/2016 | Inamdar et al. |
| 9,344,092 B2 | 5/2016 | Abraham et al. |
| 9,355,364 B2 | 5/2016 | Miller et al. |
| 9,369,133 B2 | 6/2016 | Naaman et al. |
| 9,383,208 B2 | 7/2016 | Mohanty |
| 9,443,576 B1 | 9/2016 | Miller |
| 9,455,707 B2 | 9/2016 | Herr et al. |
| 9,466,643 B2 | 10/2016 | Herr et al. |
| 9,467,126 B1 | 10/2016 | Naaman et al. |
| 9,473,124 B1 | 10/2016 | Mukhanov et al. |
| 9,520,180 B1 * | 12/2016 | Mukhanov .............. G11C 11/44 |
| 9,661,596 B2 * | 5/2017 | Gupta ............... H04W 56/0015 |
| 9,712,172 B2 * | 7/2017 | Shauck ................ H03K 19/195 |
| 9,812,192 B1 * | 11/2017 | Burnett .................. G11C 11/44 |
| 9,853,645 B1 | 12/2017 | Mukhanov et al. |
| 9,887,000 B1 * | 2/2018 | Mukhanov .............. G11C 11/44 |
| 2001/0025012 A1 | 9/2001 | Tarutani et al. |
| 2001/0035524 A1 | 11/2001 | Zehe |
| 2002/0060635 A1 * | 5/2002 | Gupta .................... H03M 1/14 341/133 |
| 2002/0075057 A1 | 6/2002 | Tanaka et al. |
| 2002/0097047 A1 | 7/2002 | Odawara |
| 2002/0117656 A1 | 8/2002 | Amin et al. |
| 2002/0117738 A1 | 8/2002 | Amin et al. |
| 2002/0121636 A1 | 9/2002 | Amin et al. |
| 2002/0128156 A1 | 9/2002 | Morooka et al. |
| 2002/0169079 A1 | 11/2002 | Suzuki et al. |
| 2002/0177529 A1 | 11/2002 | Ustinov |
| 2002/0179937 A1 | 12/2002 | Ivanov et al. |
| 2002/0179939 A1 | 12/2002 | Ivanov et al. |
| 2002/0188578 A1 | 12/2002 | Amin et al. |
| 2002/0190381 A1 | 12/2002 | Herr et al. |
| 2003/0016069 A1 | 1/2003 | Furuta et al. |
| 2003/0028338 A1 | 2/2003 | Hidaka |
| 2003/0039138 A1 | 2/2003 | Herr |
| 2003/0057441 A1 | 3/2003 | Ivanov et al. |
| 2003/0058026 A1 | 3/2003 | Johnson |
| 2003/0068832 A1 | 4/2003 | Koval et al. |
| 2003/0071258 A1 | 4/2003 | Zagoskin et al. |
| 2003/0076251 A1 | 4/2003 | Gupta et al. |
| 2003/0111659 A1 | 6/2003 | Tzalenchuk et al. |
| 2003/0111661 A1 | 6/2003 | Tzalenchuk et al. |
| 2003/0121028 A1 | 6/2003 | Coury et al. |
| 2003/0130127 A1 | 7/2003 | Hentges et al. |
| 2003/0146429 A1 | 8/2003 | Tzalenchuk et al. |
| 2003/0146430 A1 | 8/2003 | Tzalenchuk et al. |
| 2003/0169041 A1 | 9/2003 | Coury et al. |
| 2003/0173498 A1 | 9/2003 | Blais et al. |
| 2003/0173997 A1 | 9/2003 | Blais et al. |
| 2003/0179831 A1 * | 9/2003 | Gupta ................... H03F 1/3247 375/296 |
| 2003/0183935 A1 | 10/2003 | Herr et al. |
| 2003/0207766 A1 | 11/2003 | Esteve et al. |
| 2003/0224944 A1 | 12/2003 | Illichev et al. |
| 2004/0000666 A1 | 1/2004 | Lidar et al. |
| 2004/0012407 A1 | 1/2004 | Amin et al. |
| 2004/0016918 A1 | 1/2004 | Amin et al. |

(56) References Cited

U.S. PATENT DOCUMENTS

| | | |
|---|---|---|
| 2004/0043740 A1 | 3/2004 | Magnusen et al. |
| 2004/0043742 A1 | 3/2004 | Beumer |
| 2004/0077503 A1 | 4/2004 | Blais et al. |
| 2004/0095803 A1 | 5/2004 | Ustinov |
| 2004/0098443 A1 | 5/2004 | Omelyanchouk et al. |
| 2004/0130311 A1 | 7/2004 | Humphreys et al. |
| 2004/0135139 A1 | 7/2004 | Koval et al. |
| 2004/0149983 A1 | 8/2004 | Lee et al. |
| 2004/0150458 A1* | 8/2004 | Gupta ............ H03K 19/1954 327/407 |
| 2004/0150462 A1 | 8/2004 | Ishizaki et al. |
| 2004/0167036 A1 | 8/2004 | Amin et al. |
| 2004/0170047 A1 | 9/2004 | Amin et al. |
| 2004/0173787 A1 | 9/2004 | Blais et al. |
| 2004/0173792 A1 | 9/2004 | Blais et al. |
| 2004/0173793 A1 | 9/2004 | Blais et al. |
| 2004/0201400 A1 | 10/2004 | Herr |
| 2004/0223380 A1 | 11/2004 | Hato |
| 2004/0232912 A1 | 11/2004 | Tsukamoto et al. |
| 2004/0238813 A1 | 12/2004 | Lidar et al. |
| 2005/0001209 A1 | 1/2005 | Hilton et al. |
| 2005/0023518 A1 | 2/2005 | Herr |
| 2005/0029512 A1 | 2/2005 | Hato et al. |
| 2005/0040843 A1 | 2/2005 | Eaton et al. |
| 2005/0047245 A1 | 3/2005 | Furuta et al. |
| 2005/0078022 A1 | 4/2005 | Hirano et al. |
| 2005/0098773 A1 | 5/2005 | Vion et al. |
| 2005/0101489 A1 | 5/2005 | Blais et al. |
| 2005/0106313 A1 | 5/2005 | Lee et al. |
| 2005/0149002 A1 | 7/2005 | Wang et al. |
| 2005/0149169 A1 | 7/2005 | Wang et al. |
| 2005/0162302 A1 | 7/2005 | Omelyanchouk et al. |
| 2005/0206376 A1 | 9/2005 | Matthews et al. |
| 2005/0208920 A1 | 9/2005 | Magnusen et al. |
| 2005/0224784 A1 | 10/2005 | Amin et al. |
| 2005/0231196 A1 | 10/2005 | Tarutani et al. |
| 2005/0250651 A1 | 11/2005 | Amin et al. |
| 2005/0256007 A1 | 11/2005 | Amin et al. |
| 2006/0049891 A1 | 3/2006 | Crete |
| 2006/0128341 A1 | 6/2006 | Magnusen et al. |
| 2006/0147154 A1 | 7/2006 | Thom et al. |
| 2006/0225165 A1 | 10/2006 | Maassen van den Brink et al. |
| 2006/0255987 A1 | 11/2006 | Nagasawa et al. |
| 2006/0290553 A1 | 12/2006 | Furuta et al. |
| 2007/0049097 A1 | 3/2007 | Hirano et al. |
| 2007/0052441 A1 | 3/2007 | Taguchi et al. |
| 2007/0069339 A1 | 3/2007 | Hato |
| 2007/0075729 A1 | 4/2007 | Kirichenko |
| 2007/0075752 A1* | 4/2007 | Kirichenko ............ H03K 23/763 327/115 |
| 2007/0077906 A1* | 4/2007 | Kirichenko ............ H03D 7/005 455/323 |
| 2007/0085534 A1 | 4/2007 | Seki et al. |
| 2007/0114994 A1 | 5/2007 | Kobayashi et al. |
| 2007/0132481 A1 | 6/2007 | Chong et al. |
| 2007/0158791 A1 | 7/2007 | Wakana et al. |
| 2007/0174227 A1 | 7/2007 | Johnson et al. |
| 2007/0180586 A1 | 8/2007 | Amin |
| 2007/0194225 A1 | 8/2007 | Zorn |
| 2007/0241747 A1 | 10/2007 | Morley et al. |
| 2007/0293160 A1* | 12/2007 | Gupta ................ H03K 17/92 455/78 |
| 2008/0048902 A1 | 2/2008 | Rylov et al. |
| 2008/0051292 A1 | 2/2008 | Wakana et al. |
| 2008/0084898 A1* | 4/2008 | Miyaho .............. H04L 47/10 370/498 |
| 2008/0086438 A1 | 4/2008 | Amin et al. |
| 2008/0101501 A1* | 5/2008 | Gupta ................ H03K 17/92 375/295 |
| 2008/0101503 A1* | 5/2008 | Gupta ................ H04B 1/005 375/338 |
| 2008/0107213 A1* | 5/2008 | Gupta ................ H03K 17/92 375/340 |
| 2008/0122434 A1 | 5/2008 | Chieh et al. |
| 2008/0146449 A1 | 6/2008 | Lesueur et al. |
| 2008/0186064 A1* | 8/2008 | Kirichenko ......... H03K 23/763 327/117 |
| 2008/0231353 A1 | 9/2008 | Filippov et al. |
| 2009/0002014 A1 | 1/2009 | Gupta et al. |
| 2009/0033369 A1 | 2/2009 | Baumgardner et al. |
| 2009/0034657 A1 | 2/2009 | Nikolova et al. |
| 2009/0057652 A1 | 3/2009 | Nevirkovets et al. |
| 2009/0073017 A1 | 3/2009 | Kim et al. |
| 2009/0082209 A1 | 3/2009 | Bunyk et al. |
| 2009/0143665 A1 | 6/2009 | Seki et al. |
| 2009/0153180 A1 | 6/2009 | Herr |
| 2009/0167342 A1 | 7/2009 | van den Brink et al. |
| 2009/0206871 A1 | 8/2009 | Baumgardner et al. |
| 2009/0237106 A1 | 9/2009 | Kirichenko |
| 2009/0261319 A1 | 10/2009 | Maekawa et al. |
| 2009/0267635 A1 | 10/2009 | Herr et al. |
| 2009/0322374 A1* | 12/2009 | Przybysz ............... B82Y 10/00 326/5 |
| 2010/0006825 A1 | 1/2010 | Wakana et al. |
| 2010/0033206 A1 | 2/2010 | Herr et al. |
| 2010/0066576 A1 | 3/2010 | Kirichenko |
| 2010/0085827 A1 | 4/2010 | Thom et al. |
| 2010/0097056 A1 | 4/2010 | Lam et al. |
| 2010/0148841 A1 | 6/2010 | Kirichenko |
| 2010/0164536 A1 | 7/2010 | Herr |
| 2010/0182039 A1 | 7/2010 | Baumgardner et al. |
| 2010/0194466 A1 | 8/2010 | Yorozu et al. |
| 2010/0207657 A1 | 8/2010 | Herr et al. |
| 2010/0237899 A1 | 9/2010 | Herr et al. |
| 2010/0306142 A1 | 12/2010 | Amin |
| 2011/0062423 A1 | 3/2011 | Boulaevskii et al. |
| 2011/0133770 A1 | 6/2011 | Przybysz et al. |
| 2011/0241765 A1 | 10/2011 | Pesetski et al. |
| 2011/0254583 A1 | 10/2011 | Herr |
| 2011/0288823 A1 | 11/2011 | Gupta |
| 2011/0298489 A1 | 12/2011 | van den Brink et al. |
| 2012/0012818 A1 | 1/2012 | Wakana et al. |
| 2012/0094838 A1 | 4/2012 | Bunyk et al. |
| 2012/0098594 A1 | 4/2012 | Zmuidzinas et al. |
| 2012/0157319 A1 | 6/2012 | Tsukamoto et al. |
| 2012/0157321 A1 | 6/2012 | Kirichenko |
| 2012/0184445 A1* | 7/2012 | Mukhanov ............ G11C 11/44 505/171 |
| 2012/0302446 A1 | 11/2012 | Ryazanov et al. |
| 2012/0320668 A1 | 12/2012 | Lewis et al. |
| 2012/0326130 A1 | 12/2012 | Maekawa et al. |
| 2013/0007087 A1 | 1/2013 | van den Brink et al. |
| 2013/0009677 A1 | 1/2013 | Naaman et al. |
| 2013/0015885 A1 | 1/2013 | Naaman et al. |
| 2013/0040818 A1 | 2/2013 | Herr et al. |
| 2013/0043945 A1 | 2/2013 | McDermott et al. |
| 2013/0093458 A1 | 4/2013 | Lynch et al. |
| 2013/0096825 A1 | 4/2013 | Mohanty |
| 2013/0207725 A1 | 8/2013 | Afshari et al. |
| 2014/0113828 A1 | 4/2014 | Gilbert et al. |
| 2014/0175380 A1* | 6/2014 | Suzuki ............... H01L 27/20 257/31 |
| 2014/0229705 A1 | 8/2014 | van den Brink et al. |
| 2014/0249033 A1 | 9/2014 | Orozco et al. |
| 2014/0253111 A1 | 9/2014 | Orozco et al. |
| 2014/0286465 A1 | 9/2014 | Gupta |
| 2014/0292428 A1 | 10/2014 | Koyama et al. |
| 2015/0032994 A1 | 1/2015 | Chudak et al. |
| 2015/0092465 A1 | 4/2015 | Herr et al. |
| 2015/0119253 A1 | 4/2015 | Yohannes et al. |
| 2015/0123741 A1 | 5/2015 | Koyama |
| 2015/0178432 A1 | 6/2015 | Muller et al. |
| 2015/0219730 A1 | 8/2015 | Tsukamoto et al. |
| 2015/0229343 A1 | 8/2015 | Gupta |
| 2015/0254571 A1 | 9/2015 | Miller et al. |
| 2015/0332164 A1 | 11/2015 | Maassen van den Brink et al. |
| 2015/0349780 A1 | 12/2015 | Naaman et al. |
| 2016/0012882 A1 | 1/2016 | Bleloch |
| 2016/0013791 A1 | 1/2016 | Herr et al. |
| 2016/0028402 A1 | 1/2016 | McCaughan et al. |
| 2016/0028403 A1 | 1/2016 | McCaughan et al. |
| 2016/0034609 A1 | 2/2016 | Herr et al. |
| 2016/0071021 A1 | 3/2016 | Raymond |

(56) References Cited

U.S. PATENT DOCUMENTS

| | | |
|---|---|---|
| 2016/0071903 A1 | 3/2016 | Herr et al. |
| 2016/0079968 A1 | 3/2016 | Strand et al. |
| 2016/0087599 A1 | 3/2016 | Naaman et al. |
| 2016/0112031 A1 | 4/2016 | Abraham et al. |
| 2016/0154068 A1 | 6/2016 | Barakat et al. |
| 2016/0156357 A1 | 6/2016 | Miller et al. |
| 2016/0164505 A1 | 6/2016 | Naaman et al. |
| 2016/0169746 A1 | 6/2016 | Koyama et al. |
| 2016/0197628 A1 | 7/2016 | Gupta |
| 2016/0221825 A1 | 8/2016 | Allen et al. |
| 2016/0233860 A1 | 8/2016 | Naaman |
| 2016/0267032 A1 | 9/2016 | Rigetti et al. |
| 2016/0267964 A1 | 9/2016 | Herr et al. |
| 2016/0292586 A1 | 10/2016 | Rigetti et al. |
| 2016/0292587 A1 | 10/2016 | Rigetti et al. |

\* cited by examiner

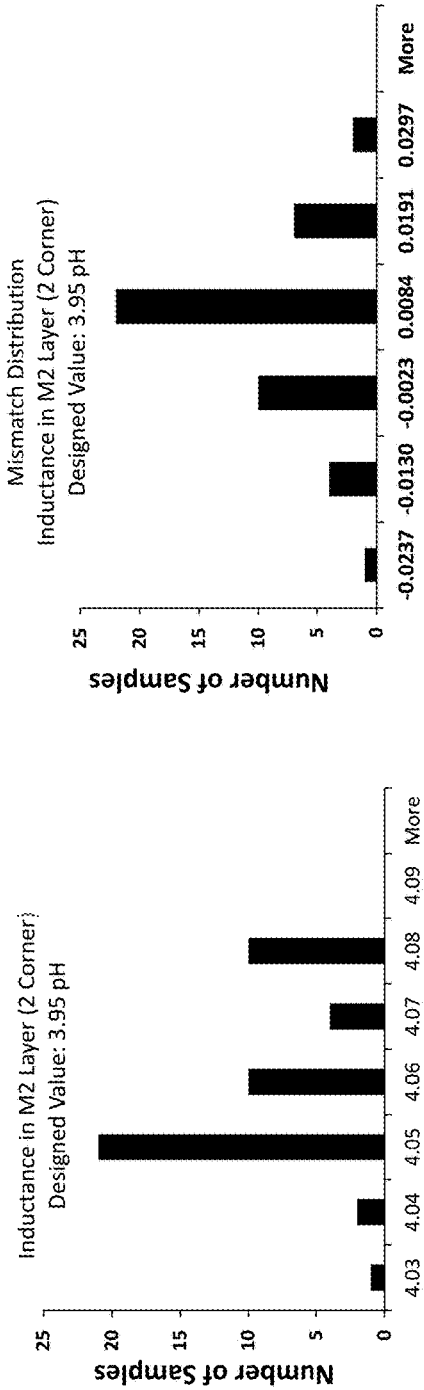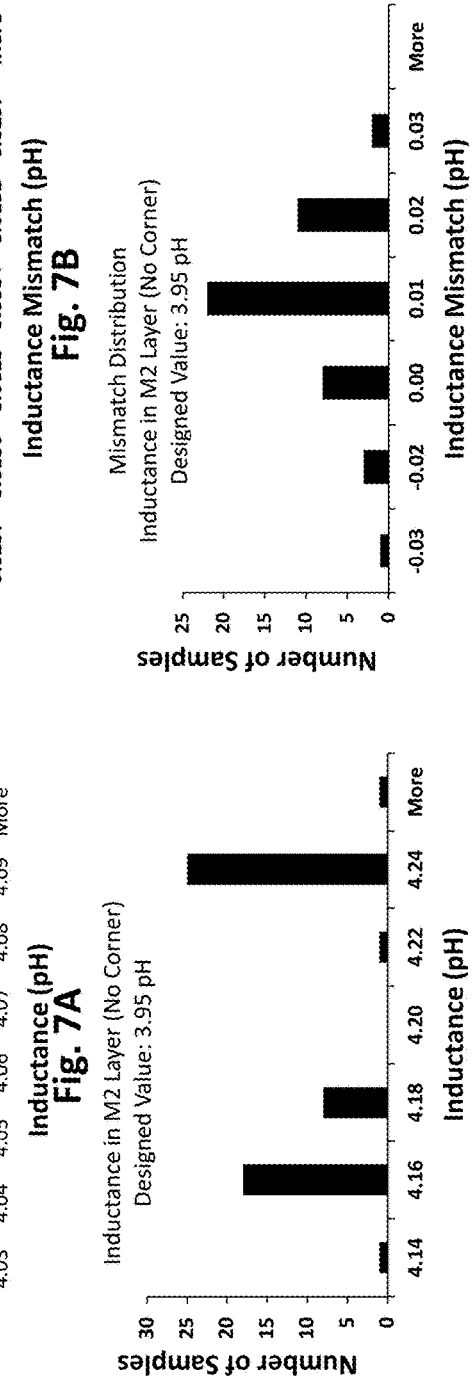

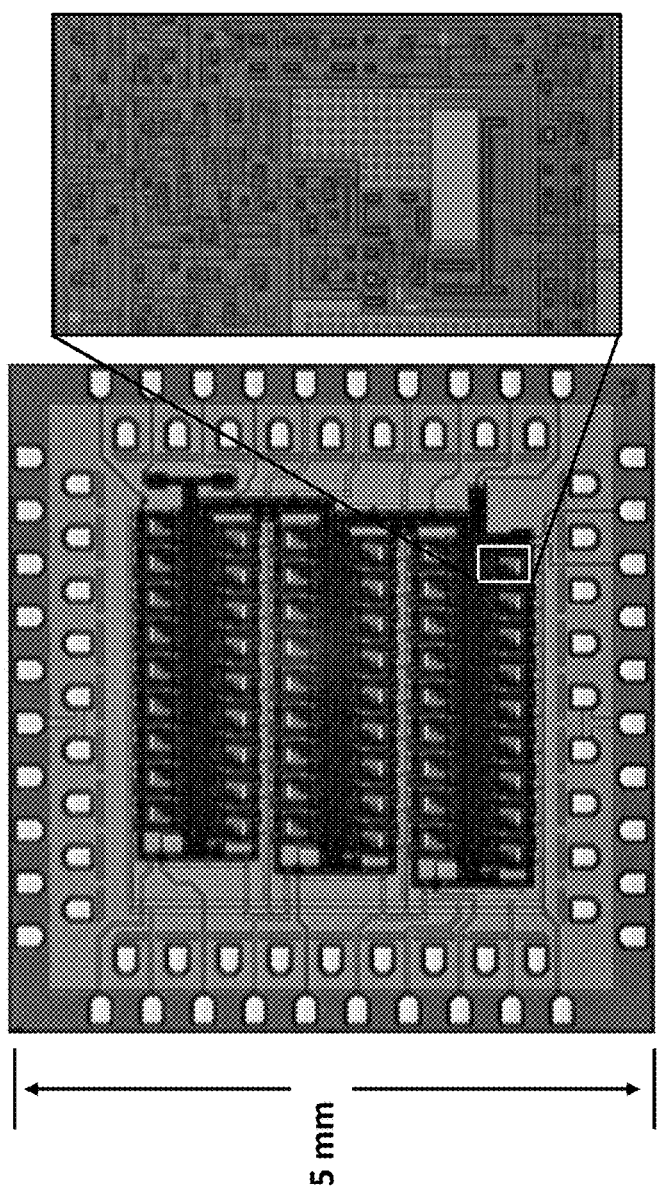

SYSTEM AND METHOD FOR ARRAY DIAGNOSTICS IN SUPERCONDUCTING INTEGRATED CIRCUIT

CROSS REFERENCE TO RELATED APPLICATIONS

The present application is a non-provisional of U.S. Provisional Patent Application No. 62/147,455, filed Apr. 14, 2015, the entirety of which is expressly incorporated herein by reference.

STATEMENT OF GOVERNMENT RIGHTS

This invention was made with government support under Grant No. N00014-12-1-0243 awarded by the US Office of Naval Research. The Government has certain rights in the invention.

FIELD OF THE INVENTION

The present invention relates to superconducting integrated circuits. In particular, it relates to diagnostic readout circuits for elements and cells in superconducting integrated circuits.

BACKGROUND OF THE INVENTION

For any integrated circuit technology, elements, devices, and cells must function with reproducible and uniform behavior. But they cannot all be tested individually; this would require an excessive number of input and output contacts. This is particularly important for a technology at the Very-Large-Scale Integration (VLSI) level, with tens of thousands of elements and beyond on a single chip. Ultrafast superconducting digital circuit technology, such as that based on rapid-single-flux-quantum logic (RSFQ), is now developing VLSI circuits, for which diagnostic testing is critical for further scaling to even higher density circuits with millions of elements per chip. RSFQ logic is based on signals comprising a time series of single-flux-quantum (SFQ) voltage pulses, each pulse comprising an integrated voltage over time of a single magnetic flux quantum $\Phi_0$=h/2e=2.07 mV-ps, where typically the pulse height is ~2 mV and the pulse width is ~1 ps. Because of the very narrow pulsewidth, RSFQ circuits are known to operate at very high clock speeds up to about 100 GHz, with extremely low power dissipation. They do, however, require cooling to deep cryogenic temperatures for operation, below the superconducting critical temperature Tc of the superconducting material. The most common superconducting material for RSFQ integrated circuits is niobium, with Tc=9.2 K.

One general approach to diagnostic testing is to fabricate an array of nominally identical devices, where different devices in the array may be appropriately activated and measured sequentially, using a minimal number of input and output lines. This is similar in concept to arrays that are used for memories or imaging, where selection techniques may be used to read out a given element in the array. One type of selector is a multiplexer (see, for example, en.wikipedia.org/wiki/Multiplexer), where a plurality of inputs are sent into the multiplexer, and only a single output is selected. A multiplexer may comprised of a plurality of selectable switches.

Superconducting Multiplexers and Demultiplexers are known in prior art superconducting electronics technology. See, for example, U.S. Pat. No. 5,982,219 ("Asynchronous Dual-Rail Demultiplexer Employing Josephson Junctions", invented by A. Kirichenko, issued Nov. 9, 1999); and U.S. Pat. No. 8,611,974 ("Systems, Methods, and Apparatus for Superconducting Demultiplexer Circuits", invented by F. Maibaum, et al., issued Dec. 17, 2013), each of which is expressly incorporated herein by reference in its entirety. Superconducting digital switches and switch arrays are also known in the prior art. See, for example, U.S. Pat. No. 7,362,125 ("Digital routing switch matrix for digitized radio frequency signals", invented by D. Gupta and A. Kirichenko, issued Apr. 22, 2008), expressly incorporated herein by reference in its entirety. See also:

A. Kirichenko, "High-speed asynchronous data multiplexing/demultiplexing", IEEE Transactions on Applied Superconductivity, vol. 9, no. 2, pp. 4046-4048, June 1999;

D. L. Miller, et al., "Single-flux-quantum demultiplexer", IEEE Transactions on Applied Superconductivity, vol. 7, no. 2, pp. 2690-2692, June 1997;

L. Zheng, et al., "RSFQ multiplexer and demultiplexer", IEEE Transactions on Applied Superconductivity, vol. 9, no. 2, pp. 3310-3313, June 1999; and L. Zheng, et al., "50 GHz multiplexer and demultiplexer designs with on-chip testing", IEICE Transactions on Electronics, vol. E85-C, no. 3, pp. 621-624, March 2002; each of which is expressly incorporated herein by reference in its entirety.

One type of superconducting output device in the prior art is the Superconducting Quantum Interference Device, or SQUID, see for example en.wikipedia.org/wiki/SQUID. A SQUID (sometimes called a DC SQUID, although it is not limited to DC applications) comprises two Josephson junctions and an inductive loop, and essentially acts as a sensitive transducer of magnetic flux $\Phi$ (coupled into the loop) to output voltage V. A SQUID actually generates a time series of SFQ pulses, with frequency $f=V/\Phi_0$ (corresponding to a pulse rate of 483 GHz/mV), so it can also be used as a digitizer. Arrays of SQUID outputs with multiplexers have been previously disclosed. See U.S. Pat. No. 5,355,085 (Y. Igarashi et al., "Multichannel SQUID flux meter with multiplexed SQUID sensors", issued Oct. 11, 1994); U.S. Pat. No. 8,593,141 (M. Radparvar and A. Kadin, "Magnetic resonance system and method employing a digital SQUID", issued Nov. 26, 2013), each of which is expressly incorporated herein by reference in its entirety.

See also:

A. M. Kadin, et al., "Superconducting digital multiplexers for sensor arrays", Proc. Int. Conf. on Thermal Detectors (TDW'03), June 2003, available online at ssed.gsfc.nasa.gov/tdw03/proceedings/docs/session_4/Kadin.pdf;

J. Chervenak, et al., "Superconducting multiplexer for arrays of transition edge sensors", Applied Physics Letters, vol. 74, pp. 4043-4045, June 1999; and A. Inamdar, J. Ren, and D. Amaro, "Improved Model-to-Hardware Correlation for Superconductor Integrated Circuits", IEEE Trans. Appl. Supercond., vol. 25, no. 3, June 2015, article 1300308, each of which is expressly incorporated herein by reference in its entirety.

SUMMARY OF THE INVENTION

Consider an array comprising a plurality of devices under test in a superconducting integrated circuit. The devices may comprise analog devices or digital devices (gates). Each device has at least one input and at least one output. Each device is subjected to a standard input, and the device output is read out using a selectable switch. In a preferred embodiment, the plurality of switches is configured as a time-domain multiplexer with only one of the plurality of device outputs connected to the multiplexer output line at a time. In this way, the behavior of the plurality of the elements may be examined, and both the individual outputs and their statistical distribution reconstructed. The switches may be configured as shown in FIG. 1, where only the first switch is ON (closed); the others are OFF (open). At a later time, switch #2 would be on and the others off, and so forth. In a further preferred embodiment, the data input signals to the switches comprise a time-series of SFQ voltage pulses, and the switches function according to RSFQ logic. In the example shown in FIG. 2, the output of the multiplexer yields a pulse train characteristic of device R1, followed by R2, followed by R3.

In a further preferred embodiment, the switches may comprise non-destructive-readout (NDRO) memory cells, one for each device in the array, with a typical circuit schematic shown in FIG. 3, where X indicates a damped Josephson junction, and the inductor associated with the storage loop is shown. The NDRO cell is a standard RSFQ cell, shown for example in the online cell library at Stony Brook University at www.physics.sunysb.edu/Physics/RSFQ/Lib/AR/ndro.html. This can be used as a switch, whereby a pulse into the SET input (which induces a current loop to be stored in the cell) turns the switch ON, so that any pulses into the DATA input are conducted to the OUT output. When a RESET pulse arrives, the switch is turned OFF, and pulses to the DATA input do not propagate. This RESET pulse also causes the stored current to be released as a pulse on the SYNC OUT line, which can be used to turn on the next switch in a series array.

In a further embodiment shown in FIG. 4, the devices being tested comprise analog elements, each biased with a common voltage. The analog output of each element is converted to a digital output (a sequence of SFQ pulses) in an appropriate analog-to-digital converter (ADC), and the converted digital output is fed to the NDRO cell, acting as a digital switch. The output of each NDRO cell is sent to a common multiplexer output line sequentially, based on a SET pulse which is sent to each NDRO switch to turn it on, and a RESET Clock pulse that turns it off and passes the SET pulse to the next NDRO switch. In this way, the signal on the array output line represents a sequential record of the digital representation of the behavior of elements in the array.

FIG. 5 shows an example of an analog element in a diagnostic array, namely a resistor, together with one embodiment of an ADC, based on a SQUID quantizer. A bias voltage V is applied across the resistor, generating a current $I=V/R$, which passes through the inductor L of the SQUID, generating a magnetic flux $\Phi=LI=LV/R$. The flux modulates the output voltage of the SQUID, and hence the output frequency of SFQ pulses, periodically with $\Phi_0$, as shown for an example in FIG. 6 for varying bias voltage V (actually measured for several elements of a test array). The pulse train due to a given resistor can be selected by the multiplexer, and transmitted to an appropriate digital processing circuit (either on-chip or external) to determine the pulse frequency or converted back to average voltage. Comparing to FIG. 2, the pulse trains exhibit frequencies f=50 GHz, 100 GHz, and 33 GHz, corresponding to SQUID output voltages $\Phi_0 f$=103 µV, 207 µV, and 68 µV, respectively.

From a plot such as FIG. 6, the response period $\Delta V=(R/L)\Phi_0$ can be measured. If L is configured to be accurately known (for example, a relatively large value that can be fabricated precisely), then R can be determined by the formula $R=L\Delta V/\Phi_0$ for each of the resistors of the diagnostic array. Alternatively, the same circuit in FIG. 5 can also be used to measure an array of diagnostic inductors $L=R\Phi_0/\Delta V$, if the resistors R are configured to be accurately known (relatively large values).

FIGS. 7A-7D show an example of one application of the present method: the measured statistical variation of 54 nominally identical inductors (each designed to be 4 pH), in either a straight (FIGS. 7C and 7D) or a right-angle (FIGS. 7A and 7B) design. The "Inductance Distribution" plots (FIGS. 7A and 7C) show the frequency of values in bins of 0.01 pH. The similar plots labeled "Mismatch Distribution" (FIGS. 7B and 7D) examine the difference between measured inductances in adjacent cells, and indicate a tighter distribution in nearby devices.

More generally, this approach can be used to measure the I-V relation for a diagnostic array of nonlinear analog devices, or the amplifier gain Vout/Vin for a 2-port analog device, or a real-time transient voltage response of a resonator or other analog device with reactive components.

In an alternative embodiment shown in FIG. 8, the Device Under Test is a digital gate rather than an analog element. In this case, the control parameter may comprise digital data (SFQ pulses) instead of (or in addition to) an analog voltage bias, and the output signal from the DUT already comprises a digital signal (SFQ pulse), so that no ADC is needed. This digital gate is not limited to a single-input-single-output device. As indicated in FIG. 8, the input may comprise K bits and the output M bits.

FIG. 9 shows how this digital device embodiment may be configured for a device with two inputs and two outputs. This has two input data lines (DATA1 and DATA2), two NDRO switches, and two output lines.

Such a diagnostic array of digital gates may be used to examine performance margins or bit error rates for a plurality of gates (which may or more not be identical), as a function of bias voltage or clock frequency. Examples of cells that may be examined using this array diagnostic technique include simple cells such as flip-flops, inverters and combinatorial gates, or more complex structures such as shift registers, half-adders, or memory cells.

While these embodiments describe sequential array readout for a linear array of elements, this concept may be extended to a two-dimensional array of readouts, or to selectable readout via an address selection. Also, while the embodiments have illustrated the case of nominally identical elements, one may alternatively fabricate a test array with any combination of nominal element values. In each case, the output permits one to compare the measured values to the nominal values.

It is therefore an object to provide a superconducting digital system, comprising: a plurality of devices under test, each device configured to generate at least one SFQ pulse output in response to an excitation condition; and a superconducting digital multiplexer comprising: a plurality of input ports, one for each device under test, configured to accept the at least one SFQ pulse output of a respective device under test; an output port, configured to propagate the at least one SFQ pulse; and a selectable switch, configured to cause the output port to reproduce the at least one SFQ pulse from a respective single input port, while blocking propagation of SFQ pulses present on all other of the plurality of input ports, dependent on a selectable state.

The at least one device under test may comprise an analog element biased with a reference voltage; and an analog-to-digital converter configured to convert the analog output of the analog element to at least one SFQ output pulse.

The analog-to-digital converter may comprise a SQUID quantizer. The analog-to-digital converter further comprise an analog input and a SQUID quantizer subjected to a magnetic flux corresponding to the signal at the analog input, the analog-to-digital converter having a digitized output comprising an SFQ pulse sequence at a rate that is periodic in the magnetic flux.

A property of the analog element may be measured by examination of the SFQ pulse sequence as a function of the reference voltage which biases the analog element.

A device under test may comprise a digital gate configured to generate at least one SFQ pulse. The digital gate may be activated by at least one SFQ data pulse. The digital gate may be activated by at least one SFQ clock pulse and/or data pulse. The digital gate may have at least one bias condition.

Each of the plurality of devices under test may comprise a nominally identical element, elements having a range of functional properties with incremental variation, or devices having distinct properties. The array may comprise, for example, 10, 16, 32, 50, 54, 64, 100, 128, or more devices under test.

The system may comprise or convey data to an analyzer. Such an analyzer may be configured to analyze the at least one SFQ pulse at the output port, to provide information on a statistical variation of the respective nominally identical element of each of the plurality of devices under test. The analyzer may also be configured to analyze the at least one SFQ pulse at the output port, to provide information on a performance margin of the respective nominally identical element of each of the plurality of devices under test. An analyzer may be provided configured to determine an information content at the multiplexer output port conveyed as a pulse frequency of the at least one SFQ pulse. An analyzer may be provided configured to determine a pulse frequency of the at least one SFQ pulse at the multiplexer output port. The system may further comprise a circuit configured to convert the information content of the multiplexer output port to a time-averaged voltage across a Josephson junction.

The plurality of devices under test and the multiplexer may be fabricated on a common superconducting integrated circuit.

The selectable switch may comprise at least one non-destructive readout (NDRO) memory cell. the at least one NDRO may comprise a SET input, a RESET input, a DATA READ input, a DATA OUT output, and a SYNCH output, wherein each of the plurality of input ports receives a representation of the at least one SFQ pulse output of the respective device under test to the DATA READ input, and the DATA OUT output is configured to transmit a representation of the at least one SFQ pulse output to the output port of the multiplexer if the SET input is selected. The selectable state of the selectable switch may be established dependent on a pulse input to the SET input of one NDRO, to thereby cause the DATA READ input of the one NDRO to be reflected at the output port. The selectable state of the selectable switch may be subsequently established to de-select the one NDRO dependent on a pulse input to the RESET input of the one NDRO, which in turn generates a pulse output from the SYNCH output. The respective SYNCH output of a plurality of the respective NDROs may each be connected to the SET input of a respective adjacent NDRO, so that de-selection of a given NDRO is followed by the selection of the adjacent NDRO. A timing of selection of respective NDROs may be controlled by pulses from a selection clock.

It is a further object to provide a method of digital readout of an array comprising a plurality of elements in a superconducting integrated circuit, comprising the steps of: (a) exciting the array comprising the plurality of elements in a continuous or periodic fashion; (b) generating a sequence of SFQ pulses from each element of the array; (c) conducting the sequence of pulses for each of the plurality of elements to a corresponding plurality of inputs of a digital multiplexer; and (d) selecting a state, within the digital multiplexer, to permit the pulses of only a single selected input of the plurality of inputs for output on a multiplexer output line.

Each of the plurality of elements may be nominally identical and produces a corresponding sequence of SFQ pulses, they may vary incrementally, or have distinct properties.

The method may further comprise analyzing reproducibility of a respective element producing a sequence of SFQ pulses at the multiplexer output line; uniformity between respective elements producing respective sequences of SFQ pulses at the multiplexer output line; a performance of a respective element producing respective sequences of SFQ pulses at the multiplexer output line with respect to a predetermined value; performance of each element of the array; a performance margin of each element of the array; and/or a statistics of individual elements or of a plurality of elements within the array.

The plurality of elements may each comprise analog devices, the exciting the array may comprise applying a bias, and the generating a sequence of SFQ pulses may comprise converting the output of the analog devices in a superconducting analog-to-digital converter.

The plurality of elements may each comprise digital devices, and the exciting may comprise generating a sequence of clock and data pulses to the plurality respective elements.

BRIEF DESCRIPTION OF THE FIGURES

FIGS. 7A-7C show the measured inductance distribution and mismatch distribution for an array of 54 inductors of two different designs.

FIGS. 13A and 13B show a layout of a chip comprising a diagnostic array of 54 analog elements (FIG. 13A), with an enlarged view of the layout of a single element (FIG. 13B) similar to FIG. 5.

DETAILED DESCRIPTION OF THE PREFERRED EMBODIMENTS

In order to measure statistical variations of superconductor circuit parameters, a large number of replicated copies of a given device need to be measured on a single chip. To increase the number of devices that can be efficiently measured on the same chip, a novel digital multiplexed read-out scheme was developed. In this scheme, the same reference signal is applied to multiple instances of the devices under test (DUT), and all the DUT outputs are multiplexed to a single output channel; a control signal is applied to select one of the multiple DUTs for readout at a given time.

Figure 1:
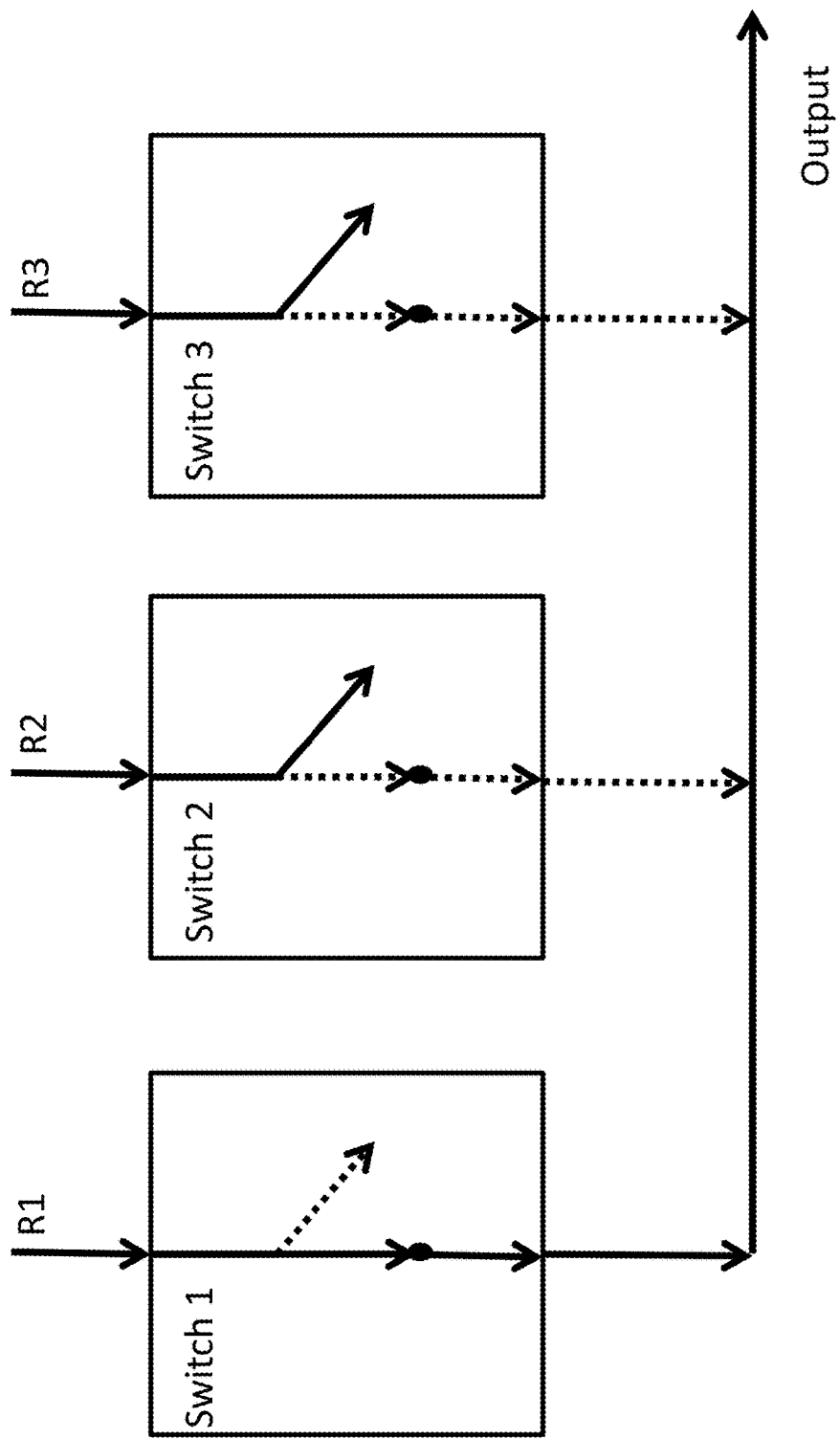
FIG. 1 shows a conceptual diagram of a multiplexer comprising a plurality of switches.
Figure 2:
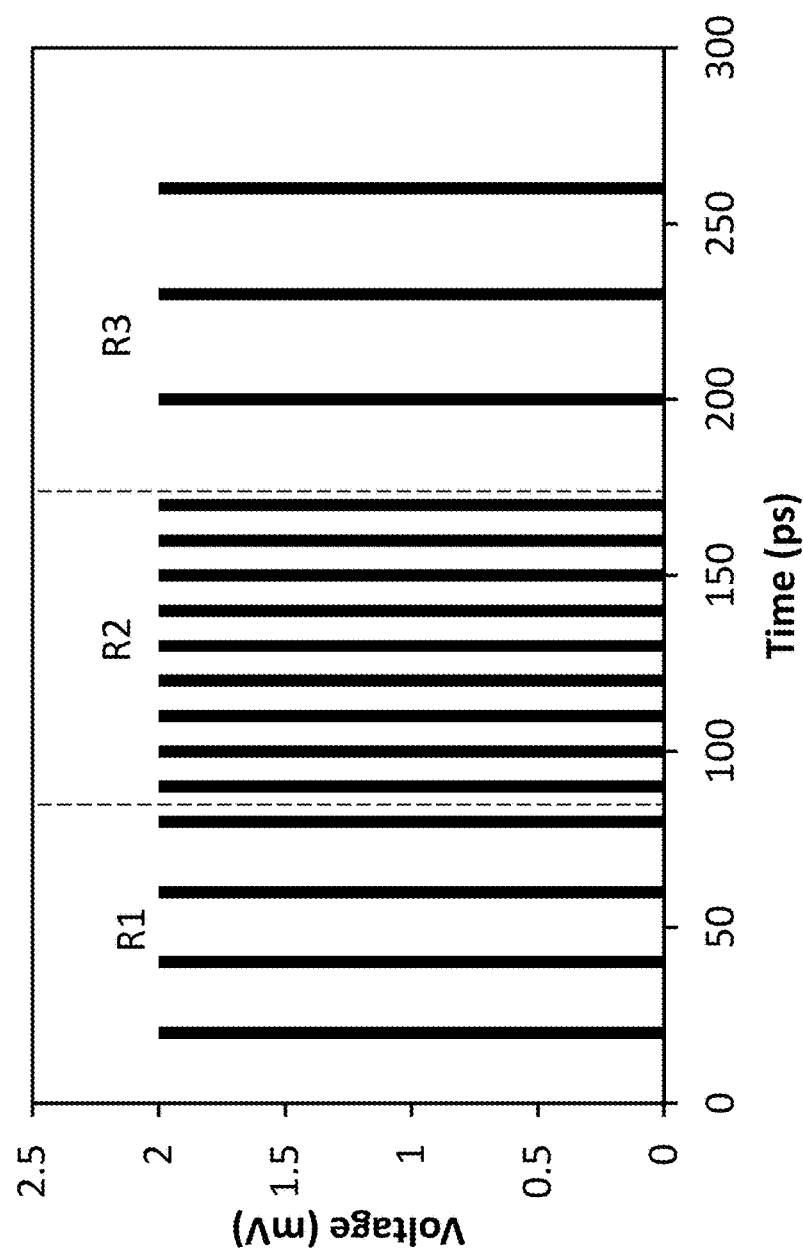
FIG. 2 shows a sequence of SFQ pulses from the output of a digital multiplexer, corresponding to the sequential output from devices R1, R2, and R3.

The basic concept of a time-domain multiplexer based on a plurality of switches is shown in FIG. 1, where signals from a large number of nominally identical elements are presented to an array of switches. The switches are controlled so that only one switch is closed at a time, permitting only the signal from a single element to pass through to the output at a time. In the present case, the signals are sequences of digital SFQ pulses, as shown in FIG. 2. Each voltage pulse has pulse height ~2 mV and pulsewidth ~1 ps, although they are not really rectangular. Because of the very fast picosecond timescale, all elements of even a large array can be queried in a short time.

Figure 3:
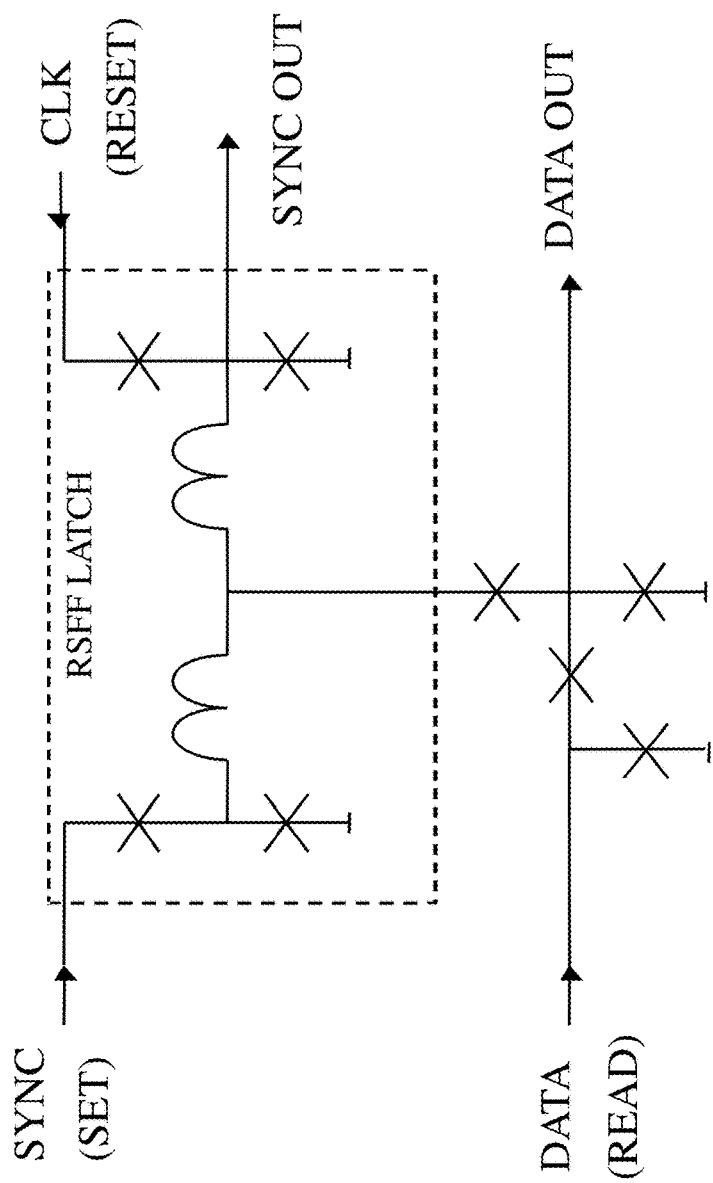
FIG. 3 shows a schematic of an RSFQ non-destructive readout (NDRO) cell functioning as a digital switch.

In a preferred embodiment, the switch comprises an NDRO memory cell, the schematic of which is shown in FIG. 3. The core of this circuit comprises 8 damped Josephson junctions (indicated by X) and inductors (shown as coils), although additional junctions may be added for optimum signal conditioning and isolation. This circuit functions as a memory cell if an SFQ pulse is sent into the SET input. This causes a lossless circulating current in the superconducting inductor to store a bit in the RS flip-flop (RSFF) latch. This state can be read out by an SFQ pulse into the READ input. If the data bit is present, an SFQ pulse is sent out the DATA OUT line. This readout is non-destructive, and can be done repeatedly. The bit storage is ended if an SFQ pulse is sent to the RESET input (also labeled clock or CLK), which also yields an SFQ output on the SYNCH OUT line. The same NDRO cell can also function as a switch if the READ input is regarded as a DATA input line. This DATA signal will propagate on the DATA OUT line if and only if the switch is ON, i.e., if there is a bit stored in the latch due to a prior SET signal, which represents the ON switch. The RESET input represents the OFF switch, and the SYNCH OUT pulse can be used to turn on the next NDRO switch in the line.

Figure 4:
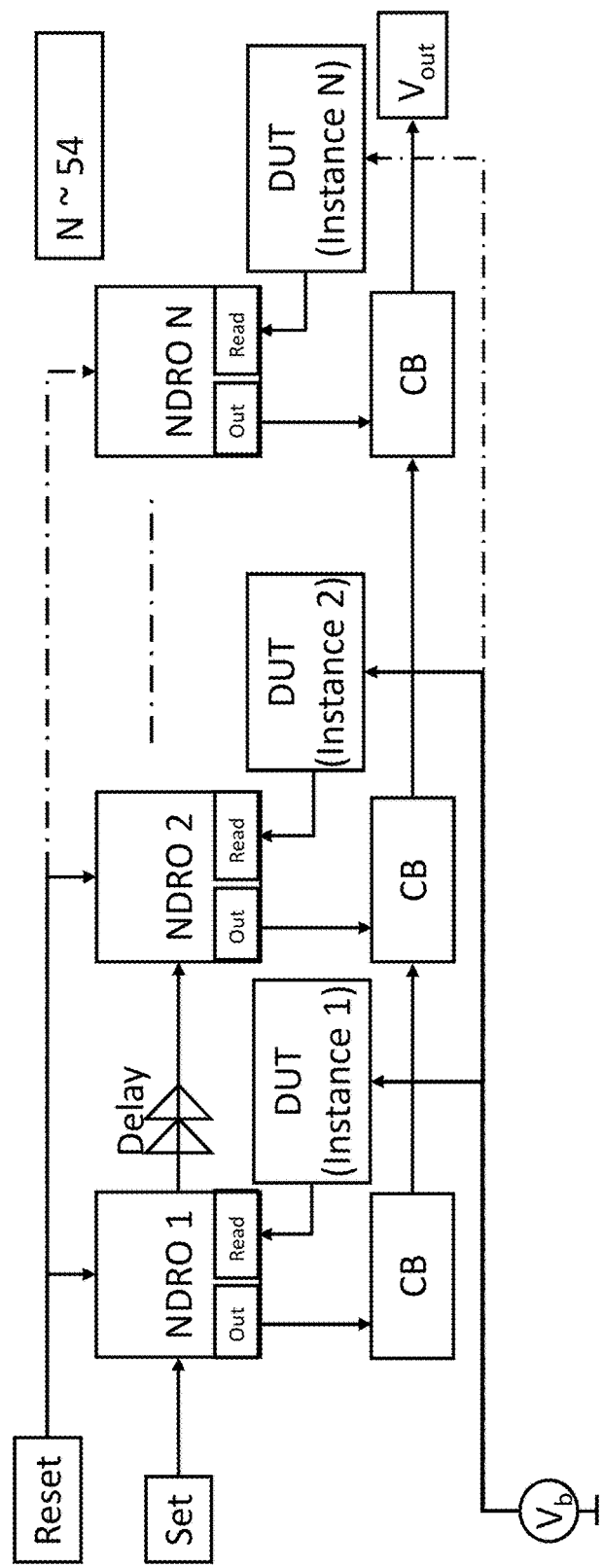
FIG. 4 shows a block diagram of a multiplexed diagnostic measurement of an array of analog elements in a superconducting integrated circuit.

FIG. 4 shows how these NDRO cells may be integrated into a multiplexer readout for diagnostic purposes, for a set of analog Devices Under Test (DUT). All the DUTs are subject to the same bias voltage $V_b$ from a common bias line, and it is assumed that the analog signal from a given DUT is converted to a digital pulse sequence (described in more detail below). All DUTs are on and generating pulses, which enter the DATA (READ) input of an NDRO cell. However, only one cell at a time is turned ON, and only that switch passes the data to the DATA OUT Line, and from there to the comment multiplexer output line.

As shown in FIG. 4, the switch selection signal first goes into the SET input of the first NDRO to turn on the switch. This remains ON until the Switch RESET signal goes into the RESET input of this first NDRO, turning it off. This RESET of an ON switch also causes the release of the memory bit, and the propagation of an SFQ pulse out the SYNCH output on the right, where it goes toward the SET input of the $2^{nd}$ NDRO cell. The RESET pulse also goes into the other RESET inputs of the other NDRO cells, but this has no effect when they are already OFF. So the RESET signal functions as the output clock for the multiplexer.

FIG. 4 also shows the presence of a small time-delay in the line between the SYNCH output of one switch and the SET input of the next switch. This is a very small delay (~several ps), which may be produced by several stages of a standard Josephson transmission line (JTL). Its purpose (in addition to regenerating the pulses) is simply to ensure that one switch is fully turned off before the next switch is turned on, so that there is never data from two switches on the multiplexer output at the same time.

The multiplexer output line in FIG. 4 comprises a standard RSFQ confluence buffer (CB) at each juncture, enabling the output pulses from a given switch to be inserted on the line, while preventing any pulses already on the line from going backwards into any of the other switches. The output signal can either be read out as a sequence of very fast digital pulses, or alternatively, as a time-averaged voltage across a Josephson junction given by $V=\Phi_0 f$, where f is the pulse frequency that may change each time the selection is passed to the next switch.

Figure 5:
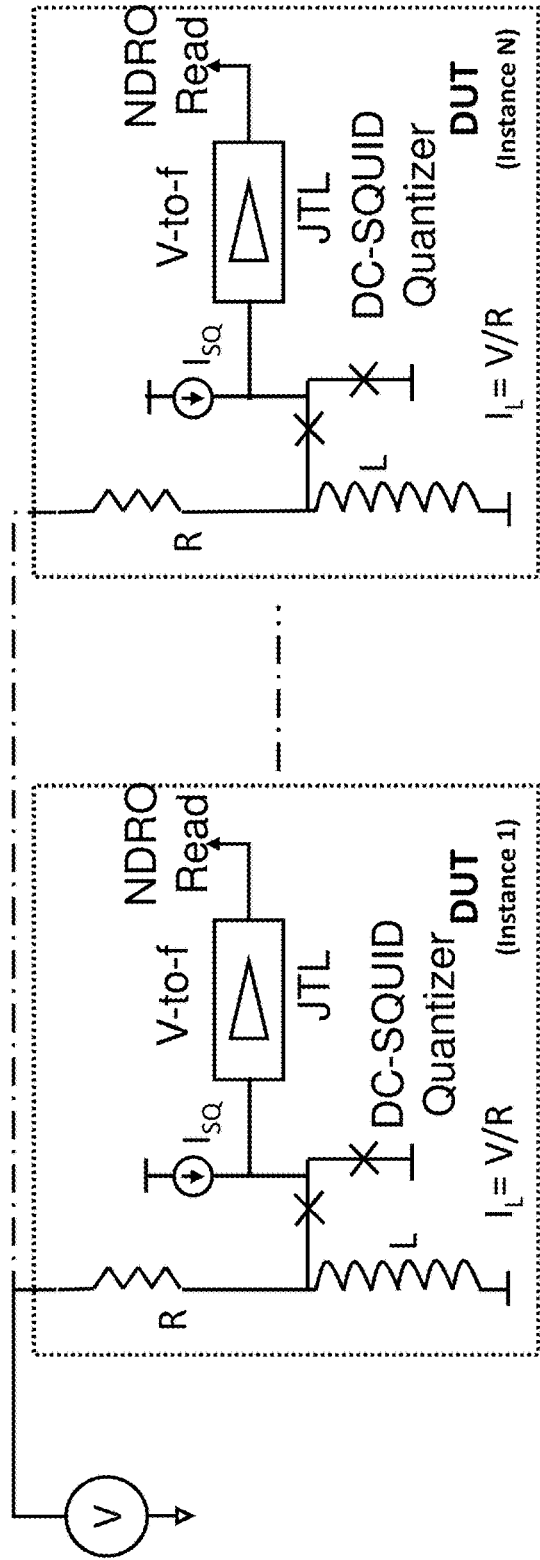
FIG. 5 shows a circuit diagram of a diagnostic measurement of inductors and resistors in a superconducting integrated circuit, together with associated SQUID quantizers.

FIG. 5 shows the detailed circuit of one embodiment of the DUT with its analog-to-digital converter (ADC). This comprises a resistor R and a SQUID quantizer. Small resistors (~10 ohms or less) are generally integrated into superconducting circuits, and the accuracy of their value is important. The SQUID comprises two similar Josephson junctions and a lossless superconducting inductor L, together with a SQUID dc bias current $I_{SQ}$ that is slightly above the parallel critical current of the junctions. In this way, the SQUID is in its voltage state, generating a rapid sequence of SFQ pulses. The presence of magnetic flux $\Phi=LI_L=LV_b/R$ into the SQUID loop modulates the SQUID output voltage, and thus the pulse frequency, periodically in flux $\Phi_0$. These pulses are maintained and regenerated in the JTL and conducted to the DATA input of the NDRO switch.

Figure 6:
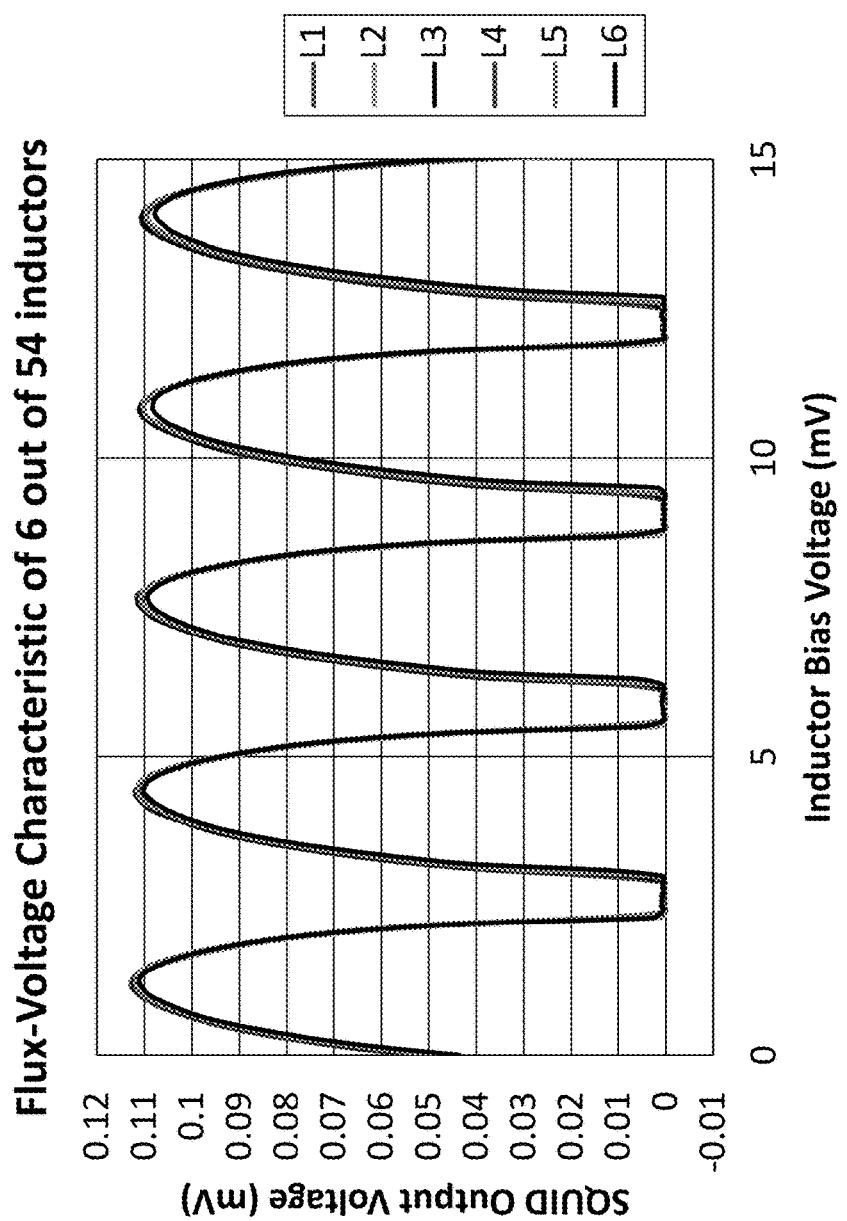
FIG. 6 shows an example of an effective SQUID transfer function that is periodic in magnetic flux for several elements in an array of inductors.

Examples of the periodic SQUID transfer function are shown in FIG. 6, as a function of $V_b$, for 6 different devices in an array of 54 devices. The periodicity is given by $\Delta V_b=\Phi_0 R/L$, although the output voltage itself also depends in part on the Josephson junctions comprising the SQUIDs. This permits one to determine the statistical variation of the parameter L/R, which can be converted to the statistical variation of either L or R if one knows either one of these accurately. For example, one can design a set of devices with a relatively large L and a relatively small R. In this case, the uncertainty in R will be dominant. In the other limit, with a relatively small L and a relatively large R, the uncertainty in L will be dominant.

Figures 10A, 10B:
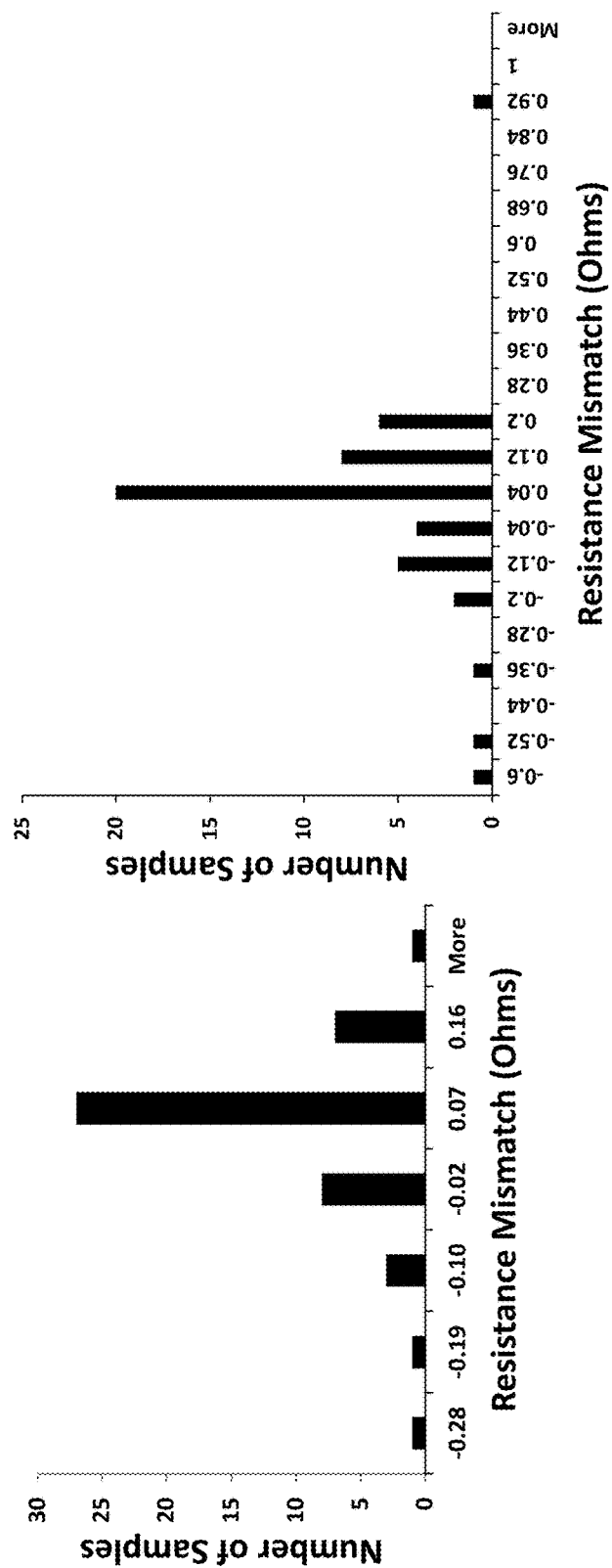
FIGS. 10A and 10B show the measured resistance mismatch distribution for an array of 54 resistors of two different nominal values.
Figure 14B:
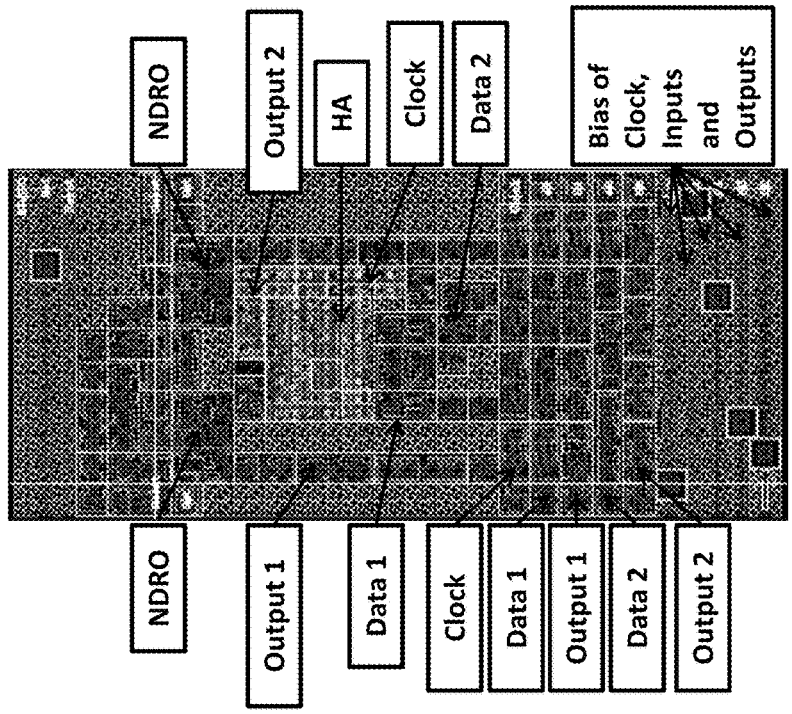
FIGS. 14A and 14B show layouts of section of a diagnostic array of digital elements, similar to FIG. 9, for an inverter (NOT gate, left) and a half-adder cell (HA gate, right).
Figure 14A:
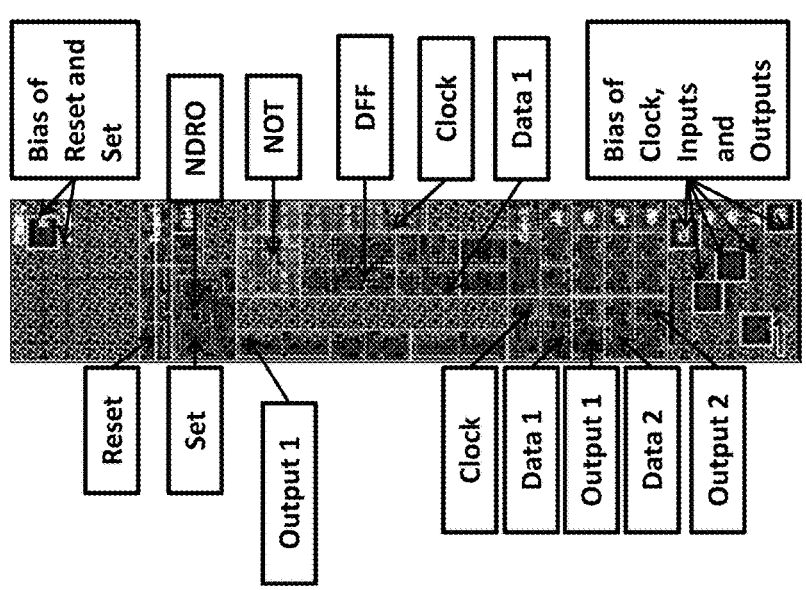

In the case where it is desired to measure a large number of devices on a single integrated circuit on a chip, such a multiplexing scheme substantially reduces the required number of contact pads (for input, output, and control lines), which no longer is a function of the number of devices being tested. The number of devices on a single chip may then be limited only by the available chip area. A diagnostic chip with hundreds or thousands of devices provides much better statistical significance than one with just a few devices. Statistical distributions of resistors and inductors prepared in this way for 54 nominally identical devices are shown in FIG. 7 (inductance distribution and neighbor mismatch distribution for two different designs of inductors) and FIGS. 10A and 10B (mismatch distribution for two different values of resistors). The layout of these 54 devices on a 5-mm chip is shown in FIGS. 14A and 14B, described further below.

Figure 11:
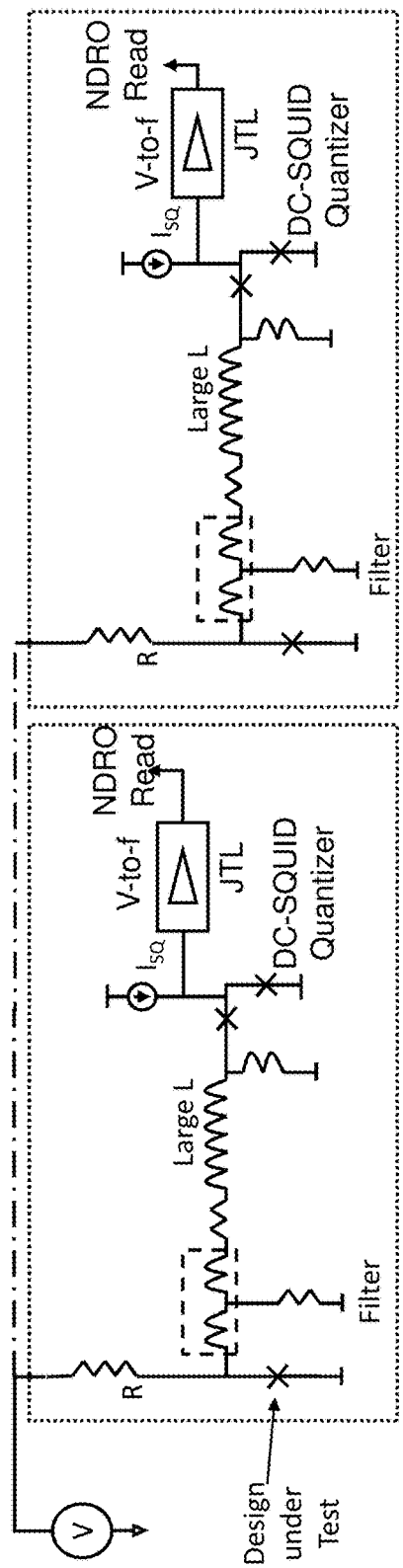
FIG. 11 shows a circuit diagram of diagnostic measurement of Josephson junctions in a superconducting integrated circuit, together with associated SQUID quantizers.

The schematic for the measurement of the critical current $I_c$ of a damped Josephson junction is shown in FIG. 11. For currents below the $I_c$, a Josephson junction acts like a small nonlinear inductance. For currents above $I_c$, the junction generates SFQ pulses, corresponding to an average voltage drop that quickly rises to an equivalent resistance ~1 ohm. For this reason, the circuit in FIG. 11 places the junction in parallel with a large inductor L, and also includes a low-pass filter that blocks the SFQ pulses from entering the SQUID. Below $I_c$, virtually all of the bias current V/R goes to the junction, and virtually none is diverted to the SQUID. But above $I_c$, much of the current V/R diverts to the SQUID, providing (filtered) flux to shift the output voltage. For this test, the output voltage of the SQUID remains at its static operating point while V is being swept, until the junction switches. The critical current of the junction is measured as the $I_c$=V/R at which the SQUID voltage shifts from its static operating point.

Figure 12:
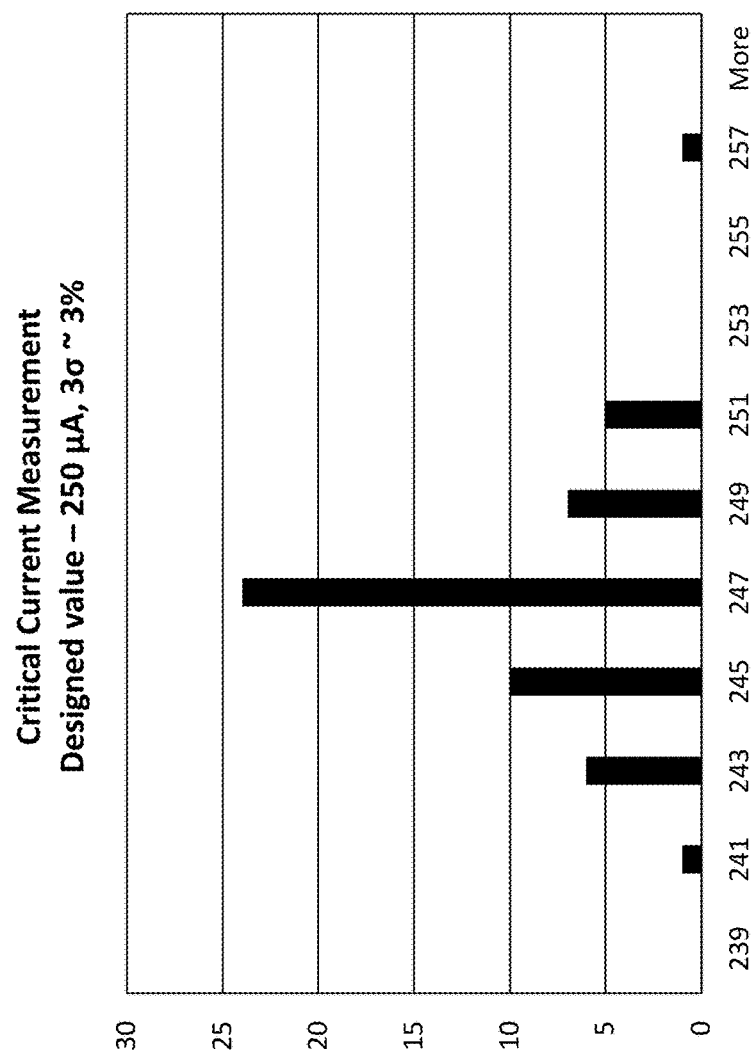
FIG. 12 shows the measured critical current distribution for an array of 54 Josephson junctions.

FIG. 12 shows the statistical variation of the measured values of $I_c$ for an array of 54 devices with a nominal $I_c$=0.25 mA.

Figure 8:
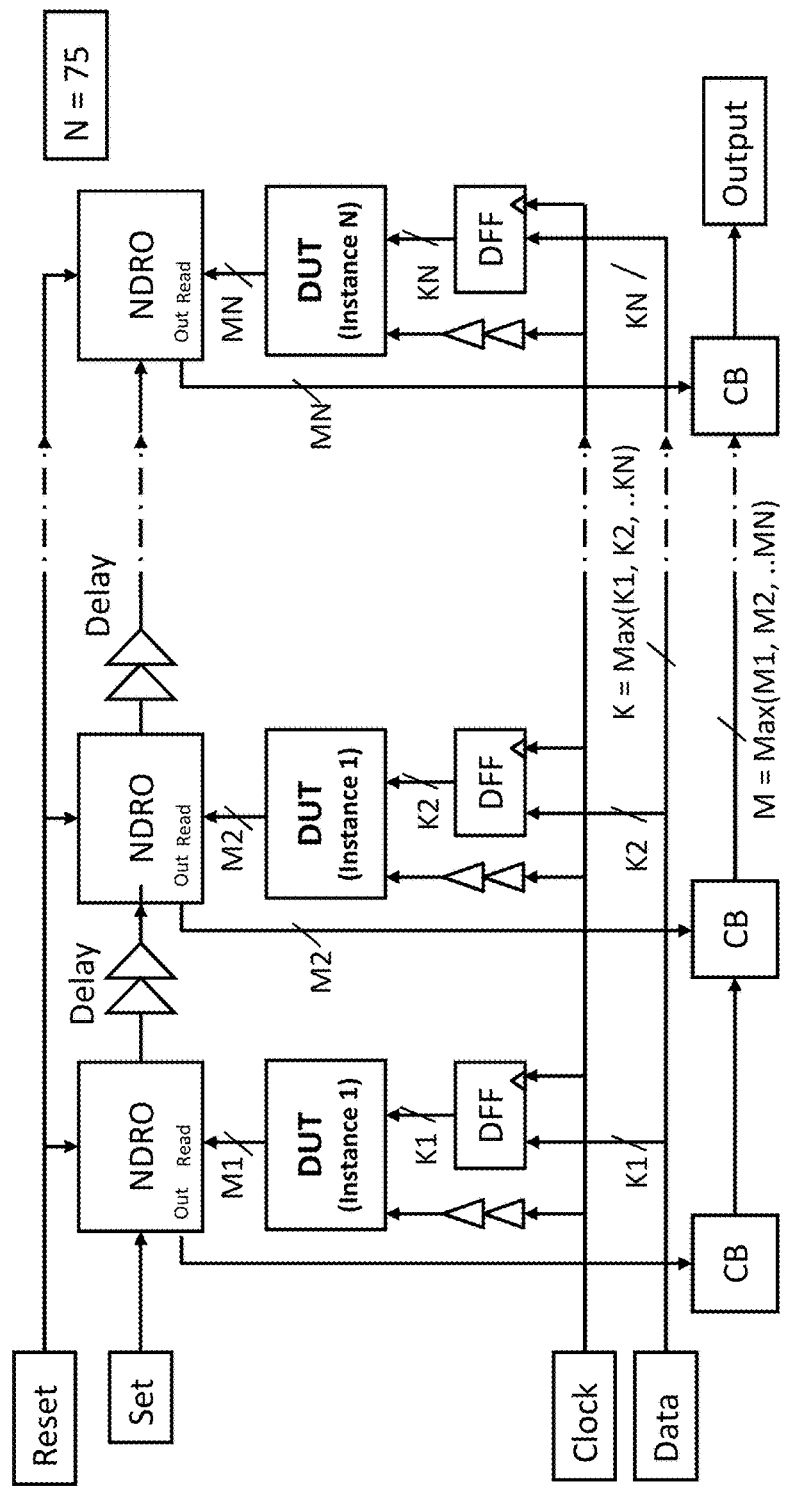
FIG. 8 shows a block diagram of a multiplexed diagnostic measurement of an array of digital gates in a superconducting integrated circuit.

Most of the previous details focused on diagnostic measurement of analog devices, but a similar method can also be applied to digital gates. This is shown in FIG. 8, where a DUT comprises a clocked RSFQ digital gate with K input bits and M output bits. The data bit(s) are first loaded into a memory cell (DFF or D-flip-flop), and then a clock signal sends the data bits into the gate, and the same clock signal activates the gate. (A short time delay is included in the activation line, to avoid race conditions.) In addition, the DUT will typically have one or more bias voltages or currents. The diagnostic information lies in the margins of performance as clock frequency and bias are varied.

While in some cases all gates in the array may be the same, it is also possible for different types of gates to be tested in the same array, provided only that there are sufficient input data lines K=Max(K1, K2, . . . KN) and output lines M=Max(M1, M2, . . . MN) for all of the types of gates.

Figure 9:
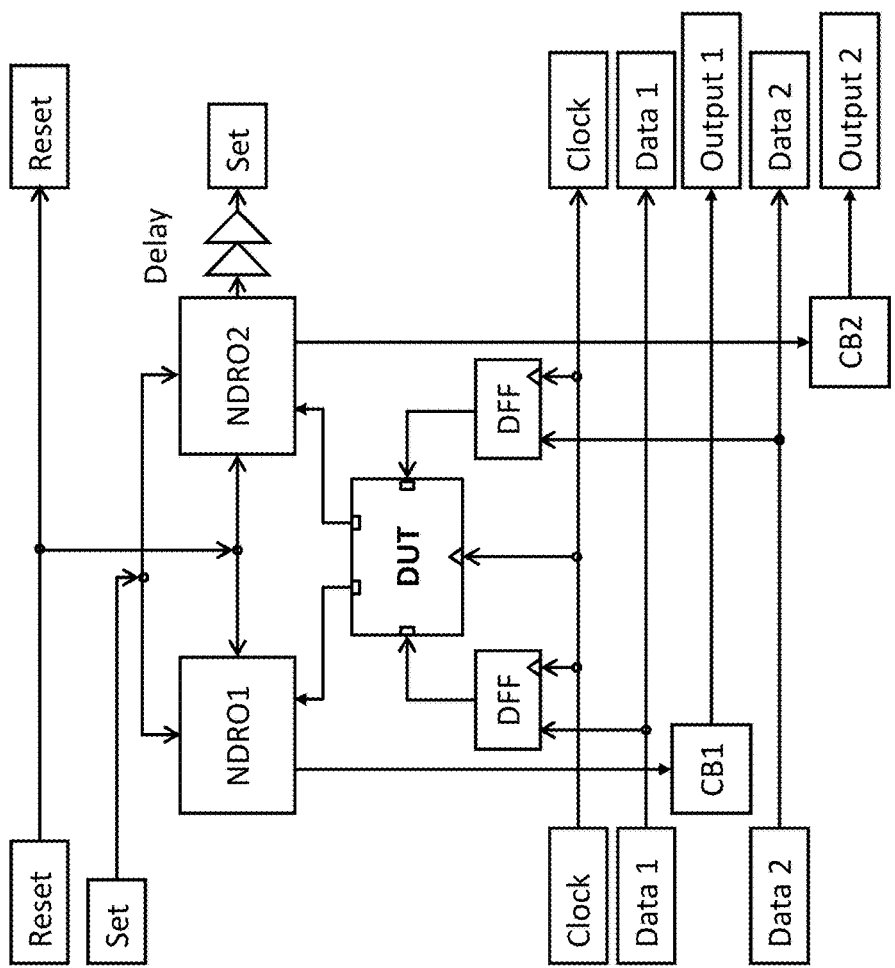
FIG. 9 shows a block diagram for a diagnostic circuit for a digital gate with two inputs and two outputs.

To illustrate this further, FIG. 9 shows a schematic circuit for a digital gate (DUT) with two inputs and two outputs. For example, this might be a one-bit half-adder (HA) cell, with two input bits, a sum output bit, and a carry output bit. Note that this comprises an input buffer (DFF) for each data bit, as well as an NDRO switch and an output line for each data bit.

FIG. 13A shows the chip layout of a diagnostic array of 54 analog devices, using niobium superconducting integrated circuits, as shown schematically in FIGS. 4 and 5. This represents 6 rows of 9 devices per row, all connected to the same meandering output line, on this 5-mm chip. An enlarged view is presented of one of the repeated devices layouts is shown in FIG. 13B. FIG. 13A also shows 40 contact pads around the periphery for signal input and output and bias voltages, together with 36 ground pads inside the contact pads. The use of the multiplexer assures that the number of these pads is sufficient, even for a large number of devices being tested.

FIGS. 14A and 14B show enlarged chip layouts for sections of a diagnostic array to test digital gates. The layout on the right is for a half-adder cell, with two DATA inputs and two OUTPUT lines. The layout on the left is for an inverter (NOT gate), with one DATA input and one OUTPUT line; a second DATA input and second OUTPUT line are not connected but pass through the cell. In this way, both types of gates can be tested as part of the same diagnostic array.

For testing the performance of an array of digital gates, one approach comprises functional testing at low speeds, for clock rates of MHz or below. The input pulse sequences can be generated using conventional electronic sources external to the superconducting circuit, and the output pulse sequences can likewise be measured real-time using conventional digital electronics at room temperature. However, these circuits are designed to operate at clock rates up to 100 GHz, which would make real-time data and measurement difficult. In this case, the input sequence can comprise an on-chip shift register (or a circular shift register for repeated data excitation) that can be downloaded at low speed, but released at high speed. Similarly, the output pulse sequence can comprise an on-chip shift register that can be loaded at high speed, but read out subsequently at lower speed. In this way, diagnostic arrays of high-speed digital gates can be tested up to full speed, and their performance margins calculated.

Other embodiments based on these principles can also be envisioned. For example, for an analog device may have a nonlinear I-V characteristic. If such a device is substituted for the resistor in FIG. 5, this characteristic may be inferred from the response to varying voltage bias. Alternatively, the voltage bias may comprise an AC or square-wave function, so that the response to transients may be examined. For digital circuits, additional information on timing margins can be obtained by incorporating variable time delays in the control circuitry.

In summary, we have presented a general method for providing diagnostic information on a large number of devices in superconducting integrated circuits, based on an RSFQ digital multiplexer. The examples presented were for 54 devices, but hundreds or thousands of devices are possible, which should provide accurate statistics. The feedback provided by such statistics is essential to advance the state of the art of superconducting VLSI fabrication technology.

One skilled in the art will readily appreciate that the present invention is well adapted to carry out the objectives and obtain the ends and advantages mentioned, as well as those inherent therein. The embodiments, methods, procedures and techniques described herein are presently representative of the preferred embodiments, are intended to be exemplary and are not intended as limitations on the scope. Changes therein and other uses will occur to those skilled in the art which are encompassed within the spirit of the invention and are defined by the scope of the appended claims. Although the invention has been described in connection with specific preferred embodiments, it should be understood that the invention as claimed should not be unduly limited to such specific embodiments. Indeed, various modifications of the described modes for carrying out the invention which are obvious to those skilled in the art are intended to be within the scope of the following claims.

What is claimed is:

1. A superconducting digital system, comprising:
a plurality of nominally identical devices under test, each device configured to generate at least one SFQ pulse output in response to an excitation condition;
a port configured to provide a common excitation condition to each of the devices under test; and
a superconducting digital multiplexer comprising:
a plurality of input ports, one for each nominally identical device under test, configured to accept the at least one SFQ pulse output of a respective device under test;
an output port, configured to propagate the at least one SFQ pulse; and
a selectable switch, configured to cause the output port to reproduce the at least one SFQ pulse from a respective single input port to preserve information comprising a statistical variation of the reproduced at least one SFQ pulse from the respective single input port under the common excitation condition, while blocking propagation of SFQ pulses present on all other of the plurality of input ports, dependent on a selectable state.

2. The superconducting digital system of claim 1, where at least one device under test comprises:
an analog element biased with a reference voltage; and
an analog-to-digital converter configured to convert the analog output of the analog element to at least one SFQ output pulse.

3. The superconducting digital system of claim 2, where the analog-to-digital converter comprises a SQUID quantizer.

4. The superconducting digital system of claim 2, where the analog-to-digital converter comprises an analog input and a SQUID quantizer subjected to a magnetic flux corresponding to the signal at the analog input, the analog-to-digital converter having a digitized output comprising an SFQ pulse sequence at a rate that is periodic in the magnetic flux.

5. The superconducting digital system of claim 4, where a property of the analog element is measured by examination of the SFQ pulse sequence as a function of the reference voltage which biases the analog element.

6. The superconducting digital system of claim 1, where a device under test comprises a digital gate configured to generate at least one SFQ pulse, and the digital gate has at least one bias condition.

7. The superconducting digital system of claim 1, where each of the plurality of devices under test comprises at least 16 nominally identical elements.

8. The superconducting digital system of claim 1, further comprising an analyzer configured to analyze the at least one SFQ pulse at the output port, to analyze a statistical variation of the respective nominally identical element of each of the plurality of devices under test.

9. The superconducting digital system of claim 1, further comprising an analyzer configured to analyze the at least one SFQ pulse at the output port, to analyze the information comprising a statistical variation of the reproduced at least one SFQ pulse, to provide information on a performance margin of the respective nominally identical element of each of the plurality of devices under test.

10. The superconducting digital system of claim 1, where the plurality of devices under test and the multiplexer are fabricated on a common superconducting integrated circuit.

11. The superconducting digital system of claim 1, where the selectable switch comprises at least one non-destructive readout (NDRO) memory cell, comprising a SET input, a RESET input, a DATA READ input, a DATA OUT output, and a SYNCH output, wherein each of the plurality of input ports receives a representation of the at least one SFQ pulse output of the respective device under test to the DATA READ input, and the DATA OUT output is configured to transmit a representation of the at least one SFQ pulse output to the output port of the multiplexer if the SET input is selected.

12. The superconducting digital system of claim 11, wherein the selectable state of the selectable switch is configured to be established dependent on a pulse input to the SET input of one NDRO, to thereby cause the DATA READ input of the one NDRO to be reflected at the output port, and to be subsequently established to de-select the one NDRO dependent on a pulse input to the RESET input of the one NDRO, to generate a pulse output from the SYNCH output.

13. The superconducting digital system of claim 12, whereby the respective SYNCH output of a plurality of the respective NDROs are each connected to the SET input of a respective adjacent NDRO, so that de-selection of a given NDRO is followed by the selection of the adjacent NDRO.

14. The superconducting digital system of claim 1, further comprising an analyzer configured to determine at least one of:
an information content at the multiplexer output port conveyed as a pulse frequency of the at least one SFQ pulse; and
a pulse frequency of the at least one SFQ pulse at the multiplexer output port.

15. The superconducting digital system of claim 14, further comprising a circuit configured to convert the information content of the multiplexer output port to a time-averaged voltage across a Josephson junction.

16. A method of digital readout of an array comprising a plurality of elements in a superconducting integrated circuit, comprising the steps of:
(a) exciting the array comprising the plurality of elements in a continuous or periodic fashion;
(b) generating a sequence of SFQ pulses from each element of the array while subject to the respective excitation comprising a statistical variation of the sequence of pulses for each of the plurality of elements;
(c) conducting the sequence of pulses for each of the plurality of elements to a corresponding plurality of inputs of a digital multiplexer to preserve information comprising the statistical variation of the sequence of pulses for each of the plurality of elements; and
(d) selecting a state, within the digital multiplexer, to permit the pulses of only a single selected input of the plurality of inputs for output on a multiplexer output line.

17. The method according to claim 16, wherein each of the plurality of elements is nominally identical and produces a corresponding sequence of SFQ pulses.

18. The method according to claim 16, further comprising analyzing reproducibility of a respective element producing a sequence of SFQ pulses at the multiplexer output line to determine at least a statistical variation of the sequence of pulses for each of the plurality of elements.

19. The method according to claim 16, further comprising analyzing uniformity between respective elements producing respective sequences of SFQ pulses at the multiplexer output line.

20. The method according to claim 16, further comprising analyzing at least one of a performance and a performance margin of a respective element producing respective sequences of SFQ pulses at the multiplexer output line with respect to a predetermined value.

21. The method according to claim 16, wherein the plurality of elements each comprise analog devices, said exciting the array comprises applying a bias, and the generating a sequence of SFQ pulses comprises converting the output of the analog devices in a superconducting analog-to-digital converter.

22. The method according to claim 16, wherein the plurality of elements each comprise digital devices, and the exciting comprises generating a sequence of clock and data pulses to the plurality respective elements.

23. A superconducting digital multiplexer system for testing a plurality of nominally identical devices under test, each device configured to generate at least one SFQ pulse output in response to an excitation condition the system comprising:

a plurality of input ports, a respective input port for each nominally identical device under test, configured to accept the at least one SFQ pulse output of a respective device under test;

a port configured to provide a common excitation condition to each of the nominally identical devices under test;

an output port, configured to propagate the at least one SFQ pulse; and a selectable switch, configured to cause the output port to reproduce the at least one SFQ pulse from a respective single input port to preserve information comprising a statistical variation of the reproduced at least one SFQ pulse from the respective single input port while under the common excitation condition, while blocking propagation of SFQ pulses present on all other of the plurality of input ports, dependent on a selectable state.

* * * * *